(12) United States Patent
Yamamura et al.

(10) Patent No.: US 8,994,135 B2
(45) Date of Patent: Mar. 31, 2015

(54) PHOTODIODE AND PHOTODIODE ARRAY

(71) Applicant: Hamamatsu Photonics K.K., Hamamatsu-shi, Shizuoka (JP)

(72) Inventors: Kazuhisa Yamamura, Hamamatsu (JP); Akira Sakamoto, Hamamatsu (JP); Terumasa Nagano, Hamamatsu (JP); Yoshitaka Ishikawa, Hamamatsu (JP); Satoshi Kawai, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 14/138,950

(22) Filed: Dec. 23, 2013

(65) Prior Publication Data

US 2014/0110808 A1 Apr. 24, 2014

Related U.S. Application Data

(62) Division of application No. 13/147,884, filed as application No. PCT/JP2010/052212 on Feb. 15, 2010.

(30) Foreign Application Priority Data

Feb. 24, 2009 (JP) ................................. 2009-041078
Jun. 5, 2009 (JP) ................................. 2009-136419

(51) Int. Cl.
*H01L 31/0232* (2014.01)
*H01L 27/146* (2006.01)
(Continued)

(52) U.S. Cl.
CPC ........ *H01L 27/1464* (2013.01); *H01L 27/1462* (2013.01); *H01L 27/1463* (2013.01);
(Continued)

(58) Field of Classification Search
None
See application file for complete search history.

(56) References Cited

U.S. PATENT DOCUMENTS 4,072,541 A 2/1978 Meulenberg, Jr. et al.
4,277,793 A 7/1981 Webb
(Continued)

FOREIGN PATENT DOCUMENTS

CN 86108413 8/1987
CN 1227419 9/1999
(Continued)

OTHER PUBLICATIONS

Office Action dated Aug. 7, 2012 that issued in U.S. Appl. No. 13/143,765 including Double Patenting rejection at pp. 2-4.
(Continued)

*Primary Examiner* — Andres Munoz
(74) *Attorney, Agent, or Firm* — Drinker Biddle & Reath LLP

(57) ABSTRACT

A photodiode array PDA1 is provided with a substrate S wherein a plurality of photodetecting channels CH have an n-type semiconductor layer 32. The photodiode array PDA1 is provided with a p⁻ type semiconductor layer 33 formed on the n-type semiconductor layer 32, resistors 24 provided for the respective photodetecting channels CH and each having one end portion connected to a signal conducting wire 23, and an n-type separating portion 40 formed between the plurality of photodetecting channels CH. The p⁻ type semiconductor layer 33 forms pn junctions at an interface to the n-type semiconductor layer 32 and has a plurality of multiplication regions AM for avalanche multiplication of carriers generated with incidence of detection target light, corresponding to the respective photodetecting channels. An irregular asperity 10 is formed in a surface of the n-type semiconductor layer 32 and the surface is optically exposed.

12 Claims, 40 Drawing Sheets

(51) Int. Cl.
   *H01L 31/0236* (2006.01)
   *H01L 31/0352* (2006.01)
   *H01L 31/103* (2006.01)
   *H01L 31/107* (2006.01)

(52) U.S. Cl.
   CPC .... *H01L27/14649* (2013.01); *H01L 27/14689* (2013.01); *H01L 31/0232* (2013.01); *H01L 31/0236* (2013.01); *H01L 31/035281* (2013.01); *H01L 31/103* (2013.01); *H01L 31/107* (2013.01); *H01L 27/14625* (2013.01); *Y02E 10/50* (2013.01); *H01L 2224/48091* (2013.01)
   USPC ............. 257/436; 257/432; 257/443; 438/71; 438/73

(56) References Cited

U.S. PATENT DOCUMENTS

| | | |
|---|---|---|
| 5,589,704 A | 12/1996 | Levine |
| 5,763,903 A | 6/1998 | Mandai et al. |
| 7,057,256 B2 | 6/2006 | Carey, III et al. |
| 7,084,443 B2 | 8/2006 | Kitano et al. |
| 7,420,257 B2 | 9/2008 | Shibayama |
| 8,008,741 B2 | 8/2011 | Yamamura et al. |
| 2001/0008144 A1 | 7/2001 | Uematsu et al. |
| 2005/0126627 A1 | 6/2005 | Hayashida |
| 2005/0127401 A1 | 6/2005 | Mazur et al. |
| 2006/0108617 A1 | 5/2006 | Kitano et al. |
| 2006/0278898 A1 | 12/2006 | Shibayama |
| 2007/0152250 A1 | 7/2007 | Kim |
| 2008/0001243 A1 | 1/2008 | Otake et al. |
| 2009/0101197 A1 | 4/2009 | Morikawa |
| 2009/0121306 A1 | 5/2009 | Ishikawa |
| 2009/0142874 A1 | 6/2009 | Arai |
| 2009/0254757 A1 | 10/2009 | Toyama et al. |
| 2011/0266644 A1 | 11/2011 | Yamamura et al. |
| 2011/0298076 A1 | 12/2011 | Yamamura et al. |
| 2011/0303999 A1 | 12/2011 | Sakamoto et al. |
| 2012/0061785 A1 | 3/2012 | Ishikawa et al. |

FOREIGN PATENT DOCUMENTS

| | | |
|---|---|---|
| CN | 1826700 | 8/2006 |
| CN | 1998083 | 7/2007 |
| EP | 0616373 | 9/1994 |
| EP | 0883189 | 12/1998 |
| EP | 1619722 | 1/2006 |
| EP | 1648036 | 4/2006 |
| EP | 1 840 967 | 10/2007 |
| EP | 185322 | 11/2007 |
| JP | S49-034398 | 9/1974 |
| JP | 50-147230 | 11/1975 |
| JP | S59-061973 | 4/1984 |
| JP | S59-117274 | 7/1984 |
| JP | 59-224183 | 12/1984 |
| JP | 62-18075 | 1/1987 |
| JP | S64-011556 | 1/1989 |
| JP | H2-007576 | 1/1990 |
| JP | H3-089518 | 4/1991 |
| JP | H4-116870 | 4/1992 |
| JP | H5-243600 | 9/1993 |
| JP | H6-045623 | 2/1994 |
| JP | H06-24444 | 9/1994 |
| JP | 6-350068 | 12/1994 |
| JP | 7-235658 | 9/1995 |
| JP | 7-240534 | 9/1995 |
| JP | 8-111542 | 4/1996 |
| JP | H08-242015 | 9/1996 |
| JP | H9-307130 | 11/1997 |
| JP | H10-070298 | 3/1998 |
| JP | H10-173998 | 6/1998 |
| JP | H10-335624 | 12/1998 |
| JP | 2000-299489 | 10/2000 |
| JP | 2002-170981 | 6/2002 |
| JP | 2002-222975 | 8/2002 |
| JP | 2002-231993 | 8/2002 |
| JP | 2003-232679 | 8/2003 |
| JP | H11-233519 | 8/2003 |
| JP | 2003-258277 | 9/2003 |
| JP | 2003-258285 | 9/2003 |
| JP | 2005-45073 | 2/2005 |
| JP | 2005-203708 | 7/2005 |
| JP | 2006-179828 | 7/2006 |
| JP | 2006-186262 | 7/2006 |
| JP | 2007-266327 | 10/2007 |
| JP | 2008-060380 | 3/2008 |
| JP | 2008-066584 | 3/2008 |
| JP | 2008-515196 | 5/2008 |
| JP | 2008-153311 | 7/2008 |
| JP | 2008-229701 | 10/2008 |
| JP | 2008-294454 | 12/2008 |
| JP | 5185206 | 4/2013 |
| TW | 200509383 | 3/2005 |
| TW | 200533898 | 10/2005 |
| WO | WO 98/43304 | 10/1998 |
| WO | WO 00/62344 | 10/2000 |
| WO | WO 03/072500 | 9/2003 |
| WO | WO 03/096427 | 11/2003 |
| WO | 2008/004547 A1 | 1/2008 |
| WO | WO 2008-139644 | 11/2008 |
| WO | WO 2009/016776 | 2/2009 |

OTHER PUBLICATIONS

G.E. Miner et al., "High Volume Processing of Point Contact Solar Cells," Photovoltaic Specialists Conference, Las Vegas, Sep. 26-30, 1988; Photovoltaic Specialists Conference, New York, IEEE, US, Sep. 26, 1998, pp. 518-522, XP000166693.

Office Action dated May 6, 2013 that issued in U.S. Appl. No. 13/147,871 including Double Patenting rejections at pp. 2-3.

Office Action dated Aug. 7, 2012 that issued in U.S. Appl. No. 13/143,765 including Double Patenting rejections at pp. 2-4.

Huang Zhihong et al., "Microstructured silicon photodetector", Applied Physics Letters, AIP, American Institute of Physics, Melville, New York, US, vol. 89, No. 3, Jul. 20, 2006, pp. 33506-1-33506-3, XP012088050.

U.S. Office Action dated Sep. 18, 2013 that issued in U.S. Appl. No. 13/320,912 including Double Patenting Rejections on pp. 3-5.

PHOTODIODE AND PHOTODIODE ARRAY

This is a divisional application of copending prior application Ser. No. 13/147,884, having a §371 date of Aug. 4, 2011, which is a national stage filing based on PCT International Application No. PCT/JP2010/052212 filed on Feb. 15, 2010. The copending application Ser. No. 13/147,884 is incorporated by reference herein in its entirety.

TECHNICAL FIELD

The present invention relates to a photodiode and a photodiode array.

BACKGROUND ART

A photodiode using compound semiconductors is known as a photodiode with a high spectral sensitivity characteristic in the near-infrared wavelength band (e.g., cf. Patent Literature 1). The photodiode described in Patent Literature 1 is provided with a first light receiving layer comprised of one of InGaAsN, InGaAsNSb, and InGaAsNP, and a second light receiving layer having an absorption edge at a longer wavelength than that of the first light receiving layer and comprised of a quantum well structure.

CITATION LIST

Patent Literature

Patent Literature 1: Japanese Patent Application Laid-open No. 2008-153311

SUMMARY OF INVENTION

Technical Problem

However, such photodiodes using the compound semiconductors are still expensive and their manufacturing steps are also complicated. For this reason, there are desires for practical application of a silicon photodiode being inexpensive and easy to manufacture and having sufficient spectral sensitivity in the near-infrared wavelength band. The conventional silicon photodiodes generally had the spectral sensitivity characteristic with the limit of about 1100 nm on the long wavelength side, but the spectral sensitivity characteristic in the wavelength band of not less than 1000 nm was not enough.

It is an object of the present invention to provide a silicon photodiode and a silicon photodiode array as a photodiode and a photodiode array having a sufficient spectral sensitivity characteristic in the near-infrared wavelength band.

Solution to Problem

A photodiode array according to the present invention is a photodiode array in which a plurality of photodetecting channels for detection target light to be entered thereinto are formed on a silicon substrate having a semiconductor layer of a first conductivity type, the photodiode array comprising: an epitaxial semiconductor layer of a second conductivity type formed on the semiconductor layer of the first conductivity type, forming pn junctions at an interface to the semiconductor layer, and having a plurality of multiplication regions for avalanche multiplication of carriers generated with incidence of the detection target light, so that the multiplication regions correspond to the respective photodetecting channels; and a plurality of resistors each having two end portions, provided for the respective photodetecting channels, and each electrically connected through one of the end portions to the epitaxial semiconductor layer and connected through the other of the end portions to a signal conducting wire, wherein an irregular asperity is formed in at least a surface corresponding to the photodetecting channels in the semiconductor layer of the first conductivity type, and wherein at least the surface corresponding to the photodetecting channels in the semiconductor layer of the first conductivity type is optically exposed.

In the photodiode array according to the present invention, the pn junctions are composed of the semiconductor layer of the first conductivity type and the epitaxial semiconductor layer formed on the semiconductor layer. The multiplication regions are formed in the epitaxial semiconductor layer where the pn junctions are substantialized, and the multiplication regions corresponding to the respective photodetecting channels are present in this epitaxial semiconductor layer. Therefore, the photodiode array has no end portions (edges) of the pn junctions to cause edge breakdown when operated in a Geiger mode, and thus there is no need for providing a guard ring. For this reason, the photodiode array can have a higher aperture rate.

In the present invention, the irregular asperity is formed in at least the surface corresponding to the photodetecting channels in the semiconductor layer of the first conductivity type. For this reason, light incident into the photodiode array is reflected, scattered, or diffused by the surface with the irregular asperity formed therein, to travel through a long distance in the silicon substrate. This causes the light incident into the photodiode to be mostly absorbed by the photodetecting channels, without passing through the photodiode array (silicon substrate). In the photodiode array, therefore, the travel distance of the light incident into the photodiode array becomes long and the distance of absorption of light also becomes long, thus improving the spectral sensitivity characteristic in the red to near-infrared wavelength band.

In the present invention, the irregular asperity is formed in the surface of the semiconductor layer of the first conductivity type. This induces recombination of unnecessary carriers generated independent of light on the surface side where the irregular asperity is formed, so as to reduce dark current. The semiconductor layer of the first conductivity type functions as an accumulation layer and prevents carriers generated by light near the surface of the semiconductor layer of the first conductivity type, from being trapped in the surface. For this reason, the carriers generated by light efficiently migrate to the multiplication regions, so as to improve the photodetection sensitivity of the photodiode array.

Another photodiode array according to the present invention is a photodiode array in which a plurality of photodetecting channels for detection target light to be entered thereinto are formed on a silicon substrate having a semiconductor layer of a first conductivity type, the photodiode array comprising: an epitaxial semiconductor layer of the first conductivity type formed on the semiconductor layer of the first conductivity type, and having a plurality of multiplication regions for avalanche multiplication of carriers generated with incidence of the detection target light, so that the multiplication regions correspond to the respective photodetecting channels; a semiconductor region of a second conductivity type formed in the epitaxial semiconductor layer of the first conductivity type and forming pn junctions at an interface to the epitaxial semiconductor layer; and a plurality of resistors each having two end portions, provided for the respective photodetecting channels, and each electrically connected through one of the end portions to the semiconductor region of the second conductivity type in the epitaxial semiconductor layer and connected through the other of the end portions to a signal conducting wire, wherein an irregular asperity is formed in at least a surface corresponding to the photodetecting channels in the semiconductor layer of the first conductivity type, and wherein at least the surface corresponding to the photodetecting channels in the semiconductor layer of the first conductivity type is optically exposed.

In the photodiode array according to the present invention, the pn junctions are composed of the epitaxial semiconductor layer of the first conductivity type and the semiconductor region of the second conductivity type formed in the semiconductor layer. The multiplication regions are formed in the epitaxial semiconductor layer where the pn junctions are substantialized, and the multiplication regions corresponding to the respective photodetecting channels are present in the epitaxial semiconductor layer. Therefore, the photodiode array has no end portions (edges) of the pn junctions to cause edge breakdown when operated in a Geiger mode, and thus there is no need for providing a guard ring. For this reason, the photodiode array can have a higher aperture rate.

According to the present invention, as described above, the travel distance of light incident into the photodiode array becomes long and the distance of absorption of light also becomes long, thus improving the spectral sensitivity characteristic in the red to near-infrared wavelength band. The semiconductor layer of the first conductivity type functions as an accumulation layer and in the present invention, it is feasible to reduce the dark current and improve the photodetection sensitivity of the photodiode.

Preferably, the irregular asperity is further formed in a surface corresponding to a region between the plurality of photodetecting channels in the semiconductor layer of the first conductivity type and the surface is optically exposed. In this case, the light incident into the region between the plurality of photodetecting channels is also reflected, scattered, or diffused by the surface with the irregular asperity formed therein, to be absorbed by any one of the photodetecting channels. Therefore, the detection sensitivity is not lowered between the photodetecting channels, so as to further improve the photodetection sensitivity.

In the photodiode array according to the present invention, a portion in the silicon substrate where the plurality of photodetecting channels are formed may be thinned while leaving a surrounding region around the thinned portion. In this case, it is feasible to obtain the photodiode array of a front-illuminated type and a back-thinned type.

In the photodiode array according to the present invention, preferably, a thickness of the semiconductor layer of the first conductivity type is larger than a height difference of the irregular asperity. In this case, as described above, it is feasible to ensure the operational effect as an accumulation layer by the first conductivity type semiconductor layer.

A photodiode according to the present invention is one comprising: a silicon substrate comprised of a semiconductor of a first conductivity type, having a first principal surface and a second principal surface opposed to each other, and having a semiconductor region of a second conductivity type formed on the first principal surface side, wherein on the silicon substrate, an accumulation layer of the first conductivity type having a higher impurity concentration than the silicon substrate is formed on the second principal surface side and an irregular asperity is formed in at least a region opposed to the semiconductor region of the second conductivity type in the second principal surface, and wherein the region opposed to the semiconductor region of the second conductivity type in the second principal surface of the silicon substrate is optically exposed.

In the photodiode according to the present invention, as described above, the travel distance of light incident into the photodiode becomes long and the distance of absorption of light also becomes long, so as to improve the spectral sensitivity characteristic in the red to near-infrared wavelength band. Furthermore, the accumulation layer of the first conductivity type formed on the second principal surface side of the silicon substrate reduces the dark current and improves the photodetection sensitivity of the photodiode.

Preferably, a portion in the silicon substrate corresponding to the semiconductor region of the second conductivity type is thinned from the second principal surface side while leaving a surrounding region around the thinned portion. In this case, the photodiode can be obtained with respective light incident surfaces on the first principal surface and second principal surface sides of the silicon substrate.

Preferably, a thickness of the accumulation layer of the first conductivity type is larger than a height difference of the irregular asperity. In this case, as described above, it is feasible to ensure the operational effect by the accumulation layer.

Advantageous Effects of Invention

The present invention provides the silicon photodiode and silicon photodiode array as the photodiode and the photodiode array with the sufficient spectral sensitivity characteristic in the near-infrared wavelength band.

DESCRIPTION OF EMBODIMENTS

The preferred embodiments of the present invention will be described below in detail with reference to the accompanying drawings. In the description, the same elements or elements with the same functionality will be denoted by the same reference signs, without redundant description.

First Embodiment

A method for manufacturing a photodiode according to the first embodiment will be described with reference to FIGS. 1 to 10. FIGS. 1 to 10 are drawings for explaining the manufacturing method of the photodiode according to the first embodiment.

Figure 1:
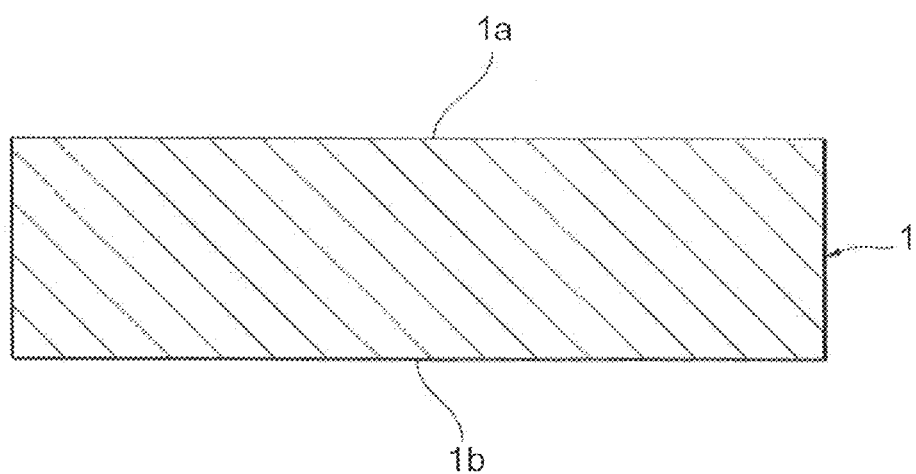
FIG. 1 is a drawing for explaining a manufacturing method of a photodiode according to the first embodiment.

The first step is to prepare an $n^-$ type semiconductor substrate 1 comprised of silicon (Si) crystal and having a first principal surface 1a and a second principal surface 1b opposed to each other (cf. FIG. 1). The $n^-$ type semiconductor substrate 1 has the thickness of about 300 μm and the resistivity of about 1 kΩ·cm. In the present embodiment, a "high impurity concentration" refers to, for example, an impurity concentration of not less than about $1\times10^{17}$ cm$^{-3}$ and is denoted by sign "+" attached to conductivity type. A "low impurity concentration" refers to, for example, an impurity concentration of not more than about $1\times10^{15}$ cm$^{-3}$ and is denoted by sign "−" attached to conductivity type. Examples of n-type impurities include antimony (Sb), arsenic (As), and so on, and examples of p-type impurities include boron (B) and others.

Figure 2:
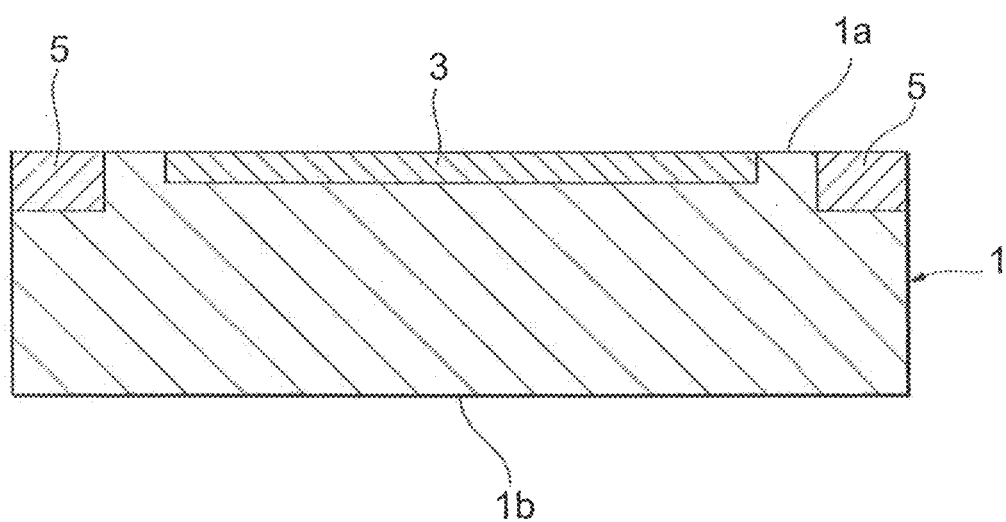
FIG. 2 is a drawing for explaining the manufacturing method of the photodiode according to the first embodiment.

Next, a $p^+$ type semiconductor region 3 and an $n^+$ type semiconductor region 5 are formed on the first principal surface 1a side of the $n^-$ type semiconductor substrate 1 (cf. FIG. 2). The $p^+$ type semiconductor region 3 is formed by diffusing a p-type impurity in a high concentration from the first principal surface 1a side in the $n^-$ type semiconductor substrate 1, using a mask opening in a central region. The $n^+$ type semiconductor region 5 is formed by diffusing an n-type impurity in a higher concentration than in the $n^-$ type semiconductor substrate 1, from the first principal surface 1a side in the $n^-$ type semiconductor substrate 1 so as to surround the $p^+$ type semiconductor region 3, using another mask opening in a peripheral region. The $p^+$ type semiconductor region 3 has the thickness of, for example, about 0.55 μm and the sheet resistance of, for example, 44 Ω/sq. The $n^+$ type semiconductor region 5 has the thickness of, for example, about 1.5 μm and the sheet resistance of, for example, 12 Ω/sq.

Figure 3:
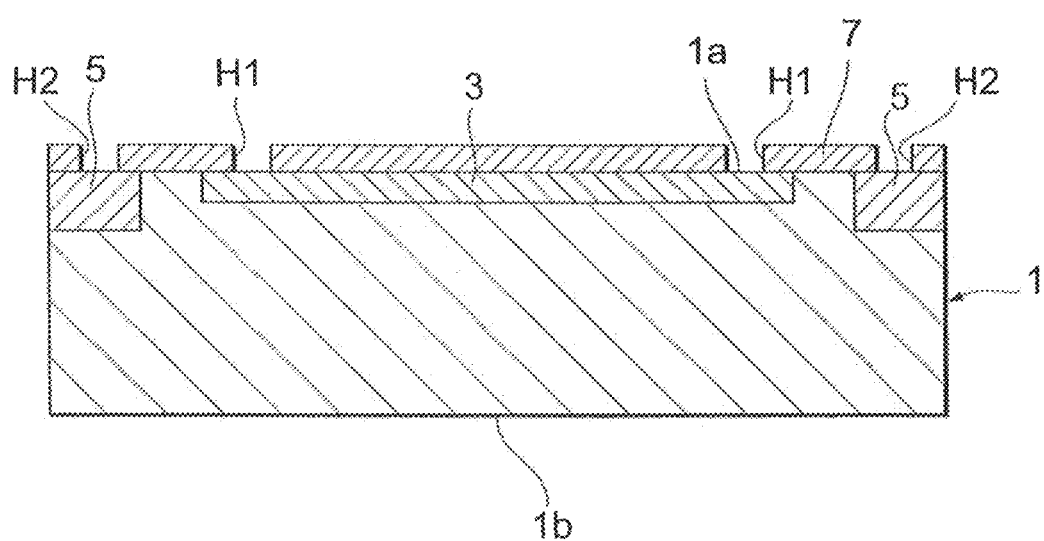
FIG. 3 is a drawing for explaining the manufacturing method of the photodiode according to the first embodiment.

Next, an insulating layer 7 is formed on the first principal surface 1a side of the $n^-$ type semiconductor substrate 1 (cf. FIG. 3). The insulating layer 7 is comprised of $SiO_2$ and is formed by thermal oxidation of the $n^-$ type semiconductor substrate 1. The insulating layer 7 has the thickness of, for example, about 0.1 μm. Thereafter, a contact hole H1 is formed in the insulating layer 7 on the $p^+$ type semiconductor region 3 and a contact hole H2 is formed in the insulating layer 7 on the $n^+$ type semiconductor region 5. An antireflective (AR) layer comprised of SiN may be formed instead of the insulating layer 7.

Figure 4:
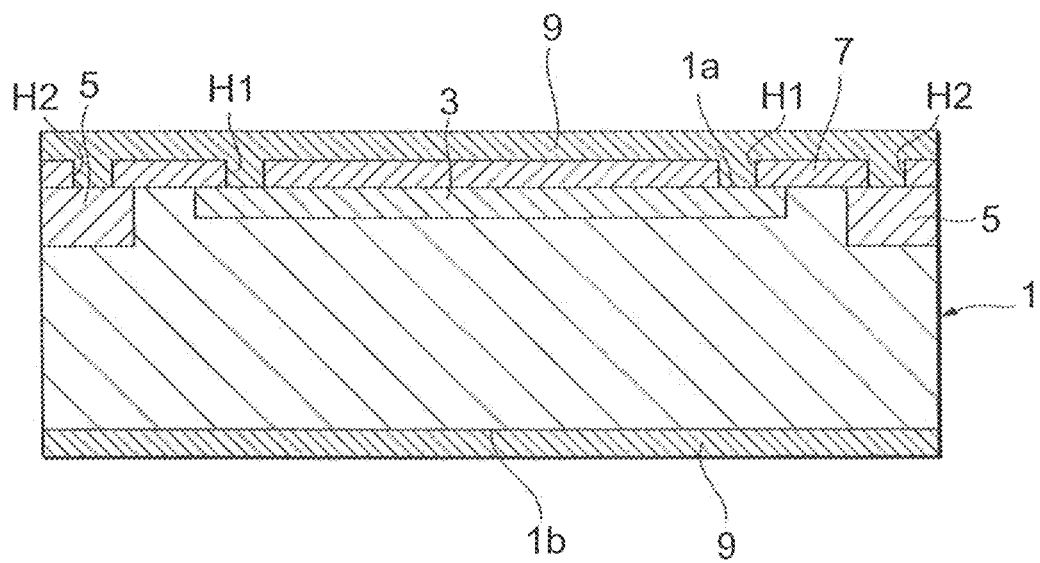
FIG. 4 is a drawing for explaining the manufacturing method of the photodiode according to the first embodiment.
Figure 5:
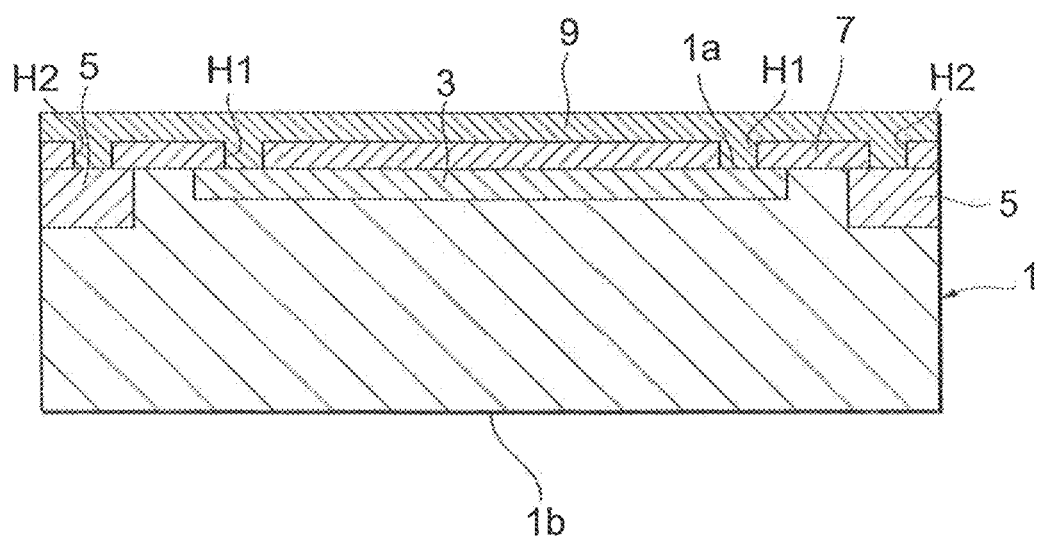
FIG. 5 is a drawing for explaining the manufacturing method of the photodiode according to the first embodiment.

Next, a passivation layer 9 is formed on the second principal surface 1b of the $n^-$ type semiconductor substrate 1 and on the insulating layer 7 (cf. FIG. 4). The passivation layer 9 is comprised of SiN and is formed, for example, by the plasma CVD process. The passivation layer 9 has the thickness of, for example, 0.1 μm. Then the n⁻ type semiconductor substrate 1 is polished from the second principal surface 1b side before the thickness of the n⁻ type semiconductor substrate 1 reaches a desired thickness (cf. FIG. 5). This process removes the passivation layer 9 from on the second principal surface 1b of the n⁻ type semiconductor substrate 1, thereby exposing the n⁻ type semiconductor substrate 1. A surface exposed by polishing is also referred to herein as the second principal surface 1b. The desired thickness is, for example, 270 μm.

Figure 6:
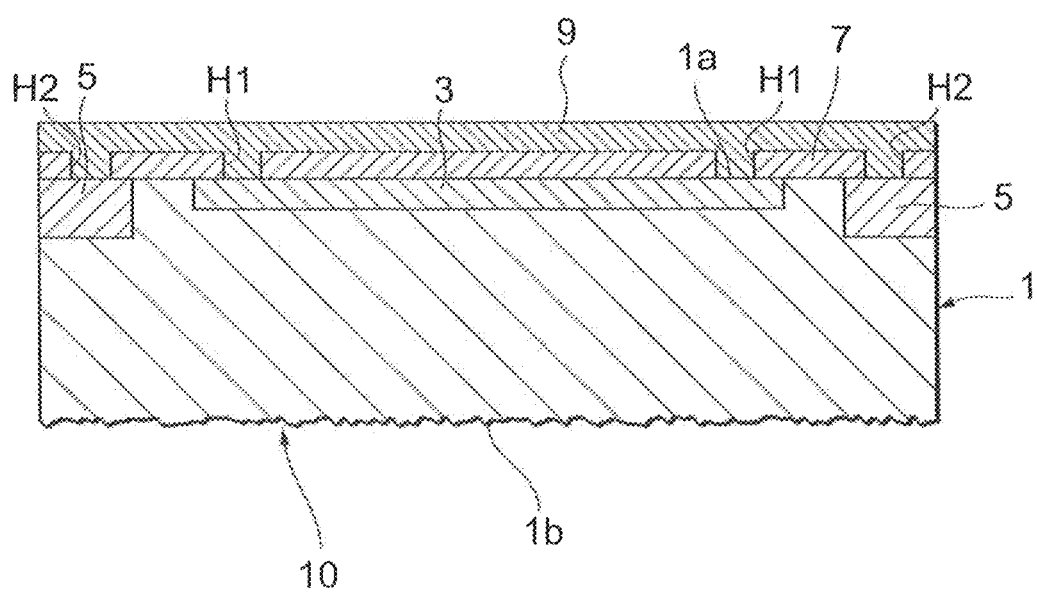
FIG. 6 is a drawing for explaining the manufacturing method of the photodiode according to the first embodiment.
Figure 7:
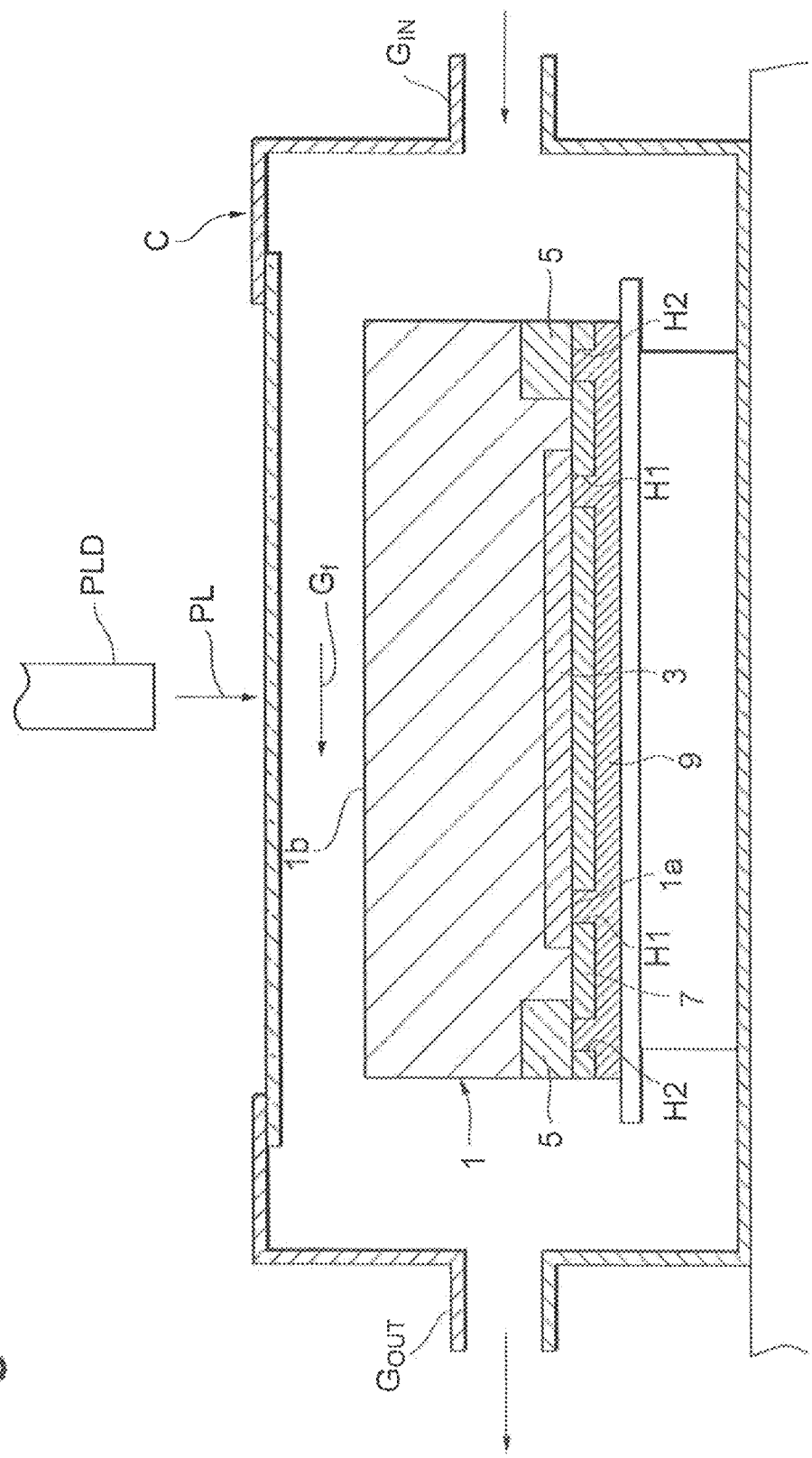
FIG. 7 is a drawing for explaining the manufacturing method of the photodiode according to the first embodiment.

Next, the second principal surface 1b of the n⁻ type semiconductor substrate 1 is subjected to irradiation with a pulsed laser beam PL, thereby forming an irregular asperity 10 (cf. FIG. 6). In this step, as shown in FIG. 7, the n⁻ type semiconductor substrate 1 is placed in a chamber C, and the n⁻ type semiconductor substrate 1 is irradiated with the pulsed laser beam PL from a pulse laser generating device PLD located outside the chamber C. The chamber C has a gas inlet port $G_{IN}$ and a gas outlet port $G_{OUT}$. An inert gas (e.g., nitrogen gas, argon gas, or the like) is introduced through the gas inlet port $G_{IN}$ and discharged through the gas outlet port $G_{OUT}$, thereby forming an inert gas flow $G_f$ in the chamber C. Dust and other materials made during the irradiation with the pulsed laser beam PL are discharged as trapped into the inert gas flow $G_f$, to the outside of the chamber C, thereby preventing processing debris, dust, and other materials from attaching to the n⁻ type semiconductor substrate 1.

Figure 8:
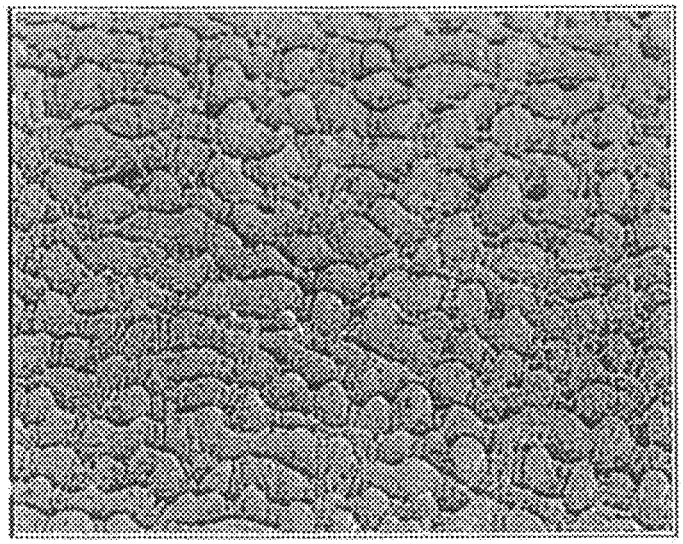
FIG. 8 is a drawing for explaining the manufacturing method of the photodiode according to the first embodiment.

In the present embodiment, the pulse laser generating device PLD to be used is a picosecond to femtosecond pulse laser generating device and a picosecond to femtosecond pulsed laser beam is applied across the entire area of the second principal surface 1b. The second principal surface 1b is roughened by the picosecond to femtosecond pulsed laser beam, whereby the irregular asperity 10 is formed throughout the entire area of the second principal surface 1b, as shown in FIG. 8. The irregular asperity 10 has facets intersecting with a direction perpendicular to the first principal surface 1a. The height difference of asperity 10 is, for example, about 0.5 to 10 μm and the spacing of projections in the asperity 10 is about 0.5 to 10 μm. The picosecond to femtosecond pulsed laser beam has the pulse duration of, for example, about 50 fs-2 ps, the intensity of, for example, about 4 to 16 GW, and the pulse energy of, for example, about 200 to 800 μJ/pulse. More generally, the peak intensity is $3\times10^{11}$ to $2.5\times10^{13}$ (W/cm²) and the fluence is about 0.1 to 1.3 (J/cm²). FIG. 8 is an SEM image resulting from observation of the irregular asperity 10 formed in the second principal surface 1b.

Figure 9:
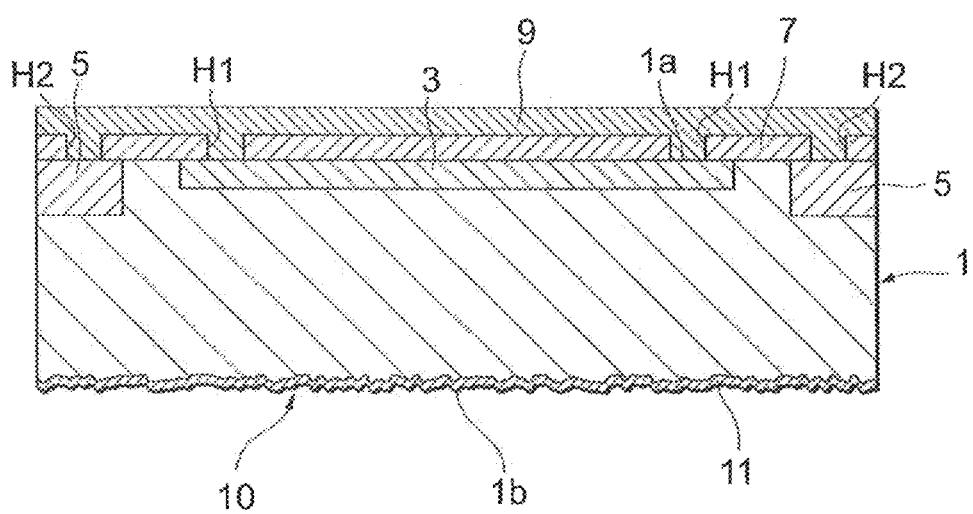
FIG. 9 is a drawing for explaining the manufacturing method of the photodiode according to the first embodiment.

Next, an accumulation layer 11 is formed on the second principal surface 1b side of the n⁻ type semiconductor substrate 1 (cf. FIG. 9). In this step, the accumulation layer 11 is formed by ion implantation or diffusion of an n-type impurity from the second principal surface 1b side in the n⁻ type semiconductor substrate 1 so that an impurity concentration thereof becomes higher than that of the n⁻ type semiconductor substrate 1. The accumulation layer 11 has the thickness of, for example, about 1 μm.

Next, the n⁻ type semiconductor substrate 1 is subjected to a thermal treatment (annealing). In this step, the n⁻ type semiconductor substrate 1 is heated, for example, in the temperature range of about 800 to 1000° C. under an ambiance of $N_2$ gas for about 0.5 to 1 hour.

Figure 10:
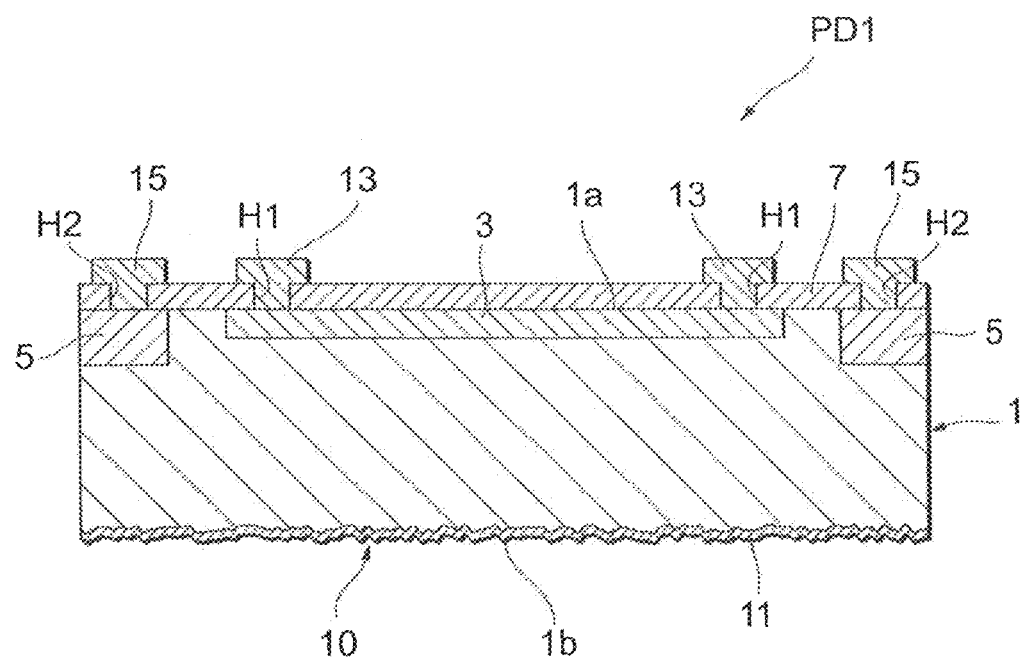
FIG. 10 is a drawing for explaining the manufacturing method of the photodiode according to the first embodiment.

Next, the passivation layer 9 formed on the insulating layer 7 is removed and thereafter electrodes 13, 15 are formed (cf. FIG. 10). The electrode 13 is formed in the contact hole H1 and the electrode 15 in the contact hole H2. The electrodes 13, 15 each are comprised of aluminum (Al) or the like and have the thickness of, for example, about 1 μm. This completes the photodiode PD1.

The photodiode PD1 is provided with the n⁻ type semiconductor substrate 1, as shown in FIG. 10. The p⁺ type semiconductor region 3 and the n⁺ type semiconductor region 5 are formed on the first principal surface 1a side of the n⁻ type semiconductor substrate 1 and a pn junction is formed between the n⁻ type semiconductor substrate 1 and the p⁺ type semiconductor region 3. The electrode 13 is in electrical contact with and connection to the p⁺ type semiconductor region 3 through the contact hole H1. The electrode 15 is in electrical contact with and connection to the n⁺ type semiconductor region 5 through the contact hole H2.

The irregular asperity 10 is formed in the second principal surface 1b of the n⁻ type semiconductor substrate 1. The accumulation layer 11 is formed on the second principal surface 1b side of the n⁻ type semiconductor substrate 1 and the second principal surface 1b is optically exposed. That the second principal surface 1b is optically exposed encompasses not only the case where the second principal surface 1b is in contact with ambient gas such as air, but also the case where an optically transparent film is formed on the second principal surface 1b.

Figure 11:
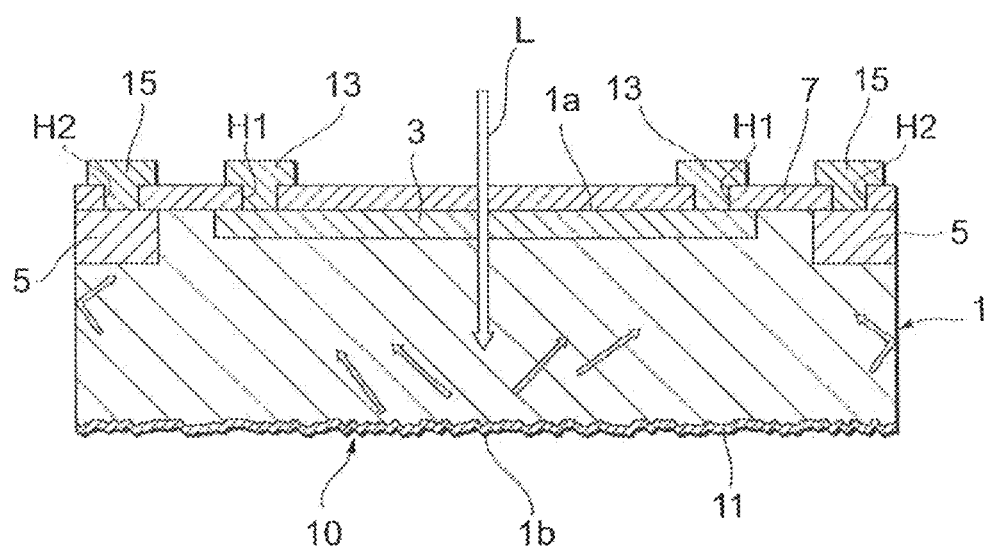
FIG. 11 is a drawing showing a configuration of the photodiode according to the first embodiment.

In the photodiode PD1, the irregular asperity 10 is formed in the second principal surface 1b. For this reason, light L incident into the photodiode PD1 is reflected, scattered, or diffused by the asperity 10, as shown in FIG. 11, to travel through a long distance in the n⁻ type semiconductor substrate 1.

Normally, Si has the refractive index n=3.5 and air the refractive index n=1.0. In a photodiode, when light is incident from a direction normal to a light incident surface, light remaining unabsorbed in the photodiode (silicon substrate) is separated into a light component reflected on the back surface to the light incident surface and a light component passing through the photodiode. The light passing through the photodiode does not contribute to the sensitivity of the photodiode. The light component reflected on the back surface to the light incident surface, if absorbed in the photodiode, becomes a photocurrent. A light component still remaining unabsorbed is reflected or transmitted by the light incident surface as the light component having reached the back surface was.

In the photodiode PD1, where light L is incident from the direction normal to the light incident surface (first principal surface 1a), when the light reaches the irregular asperity 10 formed in the second principal surface 1b, light components arriving thereat at angles of not less than 16.6° to a direction of emergence from the asperity 10 are totally reflected by the asperity 10. Since the asperity 10 is formed irregularly, it has various angles to the emergence direction and the totally reflected light components diffuse into various directions. For this reason, the totally reflected light components include light components absorbed inside the n⁻ type semiconductor substrate 1 and light components arriving at the first principal surface 1a and side faces.

Since the light components arriving at the first principal surface 1a and side faces travel in various directions because of the diffusion on the asperity 10, the light components arriving at the first principal surface 1a and the side faces are extremely highly likely to be totally reflected on the first principal surface 1a and the side faces. The light components totally reflected on the first principal surface 1a and the side faces are repeatedly totally reflected on different faces to further increase their travel distance. The light L incident into the photodiode PD1 is absorbed in the n⁻ type semiconductor substrate 1 during travel through the long distance inside the n⁻ type semiconductor substrate 1 to be detected as a photocurrent.

The light L incident into the photodiode PD1 mostly travels, without being transmitted by the photodiode PD1, through the long travel distance to be absorbed in the n⁻ type semiconductor substrate 1. Therefore, the photodiode PD1 is improved in the spectral sensitivity characteristic in the red to near-infrared wavelength band.

If a regular asperity is formed in the second principal surface 1b, the light components arriving at the first principal surface 1a and the side faces are diffused by the asperity but travel in uniform directions. Therefore, the light components arriving at the first principal surface 1a and the side faces are less likely to be totally reflected on the first principal surface 1a and the side faces. This results in increase in light passing through the first principal surface 1a and the side faces, and through the second principal surface 1b, and thus the travel distance of the light incident into the photodiode must be short. As a result, it becomes difficult to improve the spectral sensitivity characteristic in the near-infrared wavelength band.

An experiment was conducted in order to check the effect of improvement in the spectral sensitivity characteristic in the near-infrared wavelength band by the first embodiment.

We fabricated a photodiode with the above-described configuration (referred to as Example 1) and a photodiode without the irregular asperity in the second principal surface of the n⁻ type semiconductor substrate (referred to as Comparative Example 1), and investigated their spectral sensitivity characteristics. Example 1 and Comparative Example 1 have the same configuration, except for the formation of the irregular asperity by irradiation with the pulsed laser beam. The size of the n⁻ type semiconductor substrate 1 was set to 6.5 mm×6.5 mm. The size of the p⁺ type semiconductor region 3, or a photosensitive region was set to 5.8 mm×5.8 mm. A bias voltage VR applied to the photodiodes was set to 0 V.

Figure 12:
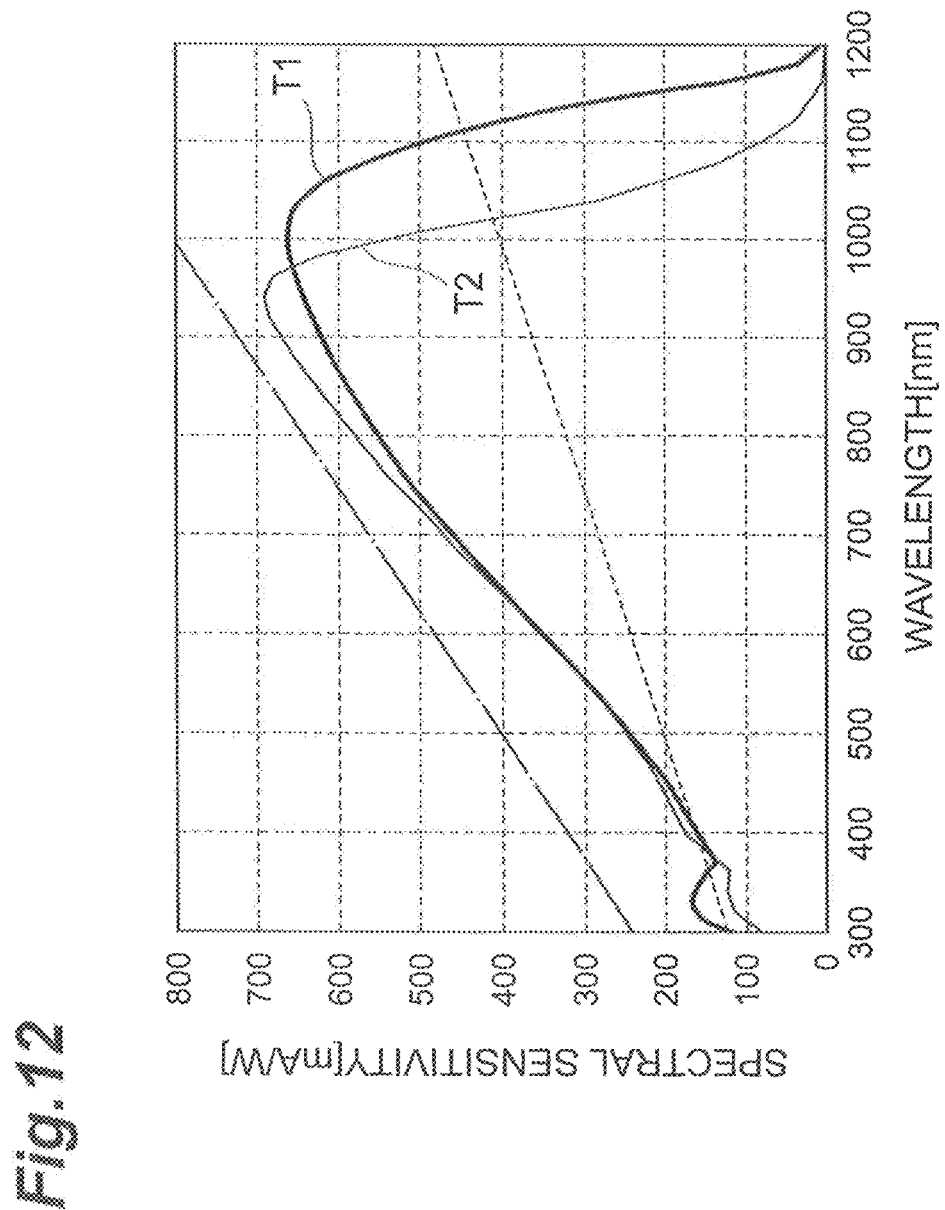
FIG. 12 is a diagram showing changes of spectral sensitivity versus wavelength in Example 1 and Comparative Example 1.

The results are shown in FIG. 12. In FIG. 12, the spectral sensitivity characteristic of Example 1 is represented by T1 and the spectral sensitivity characteristic of Comparative Example 1 by characteristic T2. In FIG. 12, the vertical axis represents the spectral sensitivity (mA/W) and the horizontal axis the wavelength of light (nm). A characteristic indicated by a chain line represents a spectral sensitivity characteristic where the quantum efficiency (QE) is 100%, and a characteristic indicated by a dashed line, a spectral sensitivity characteristic where the quantum efficiency is 50%.

As seen from FIG. 12, for example at 1064 nm, the spectral sensitivity in Comparative Example 1 is 0.2 A/W (QE=25%) whereas the spectral sensitivity in Example 1 is 0.6 A/W (QE=72%); thus the spectral sensitivity in the near-infrared wavelength band is drastically improved.

Figure 13:
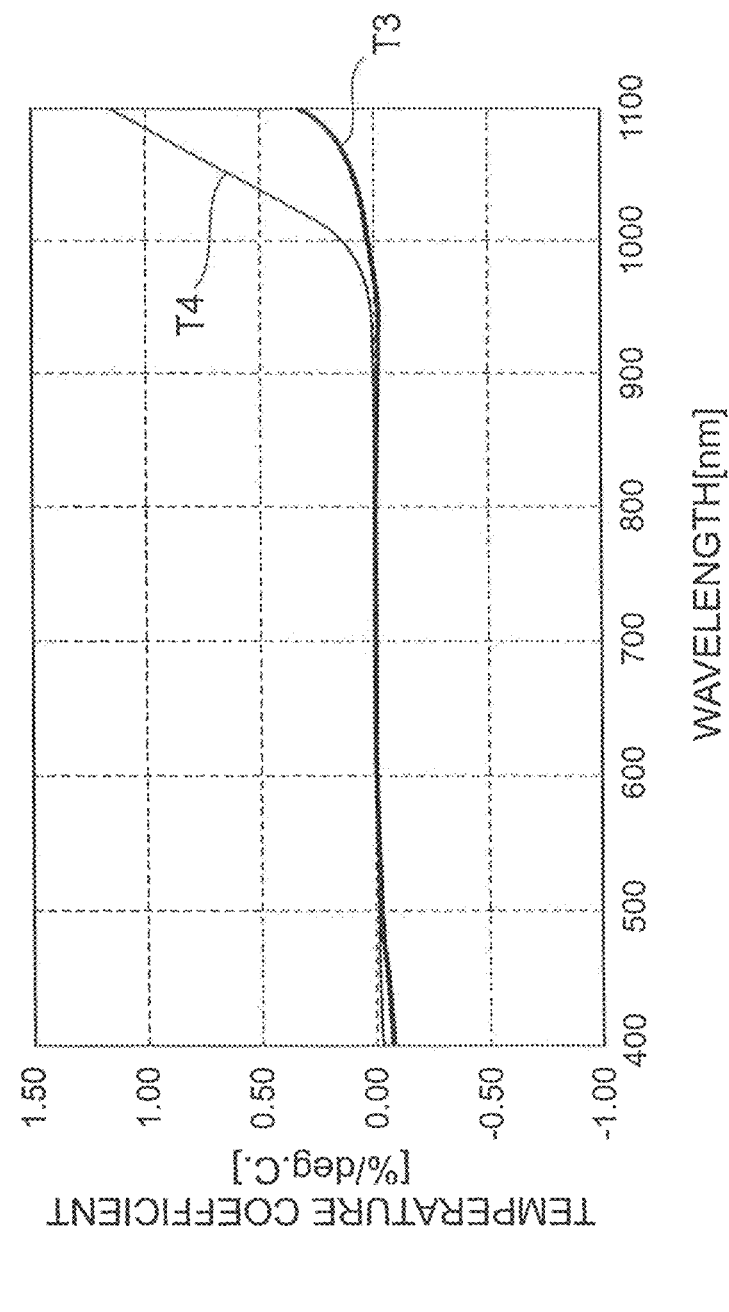
FIG. 13 is a diagram showing changes of temperature coefficient versus wavelength in Example 1 and Comparative Example 1.

We also checked temperature characteristics of spectral sensitivity in Example 1 and Comparative Example 1. We investigated the spectral sensitivity characteristics with increase in ambient temperature from 25° C. to 60° C. and calculated a rate (temperature coefficient) of spectral sensitivity at 60° C. to spectral sensitivity at 25° C. The results are shown in FIG. 13. In FIG. 13, the characteristic of temperature coefficient of Example 1 is represented by T3 and that of Comparative Example 1 by characteristic T4. In FIG. 13, the vertical axis represents the temperature coefficient (% PC) and the horizontal axis the wavelength of light (nm).

As seen from FIG. 13, for example at 1064 nm, the temperature coefficient in Comparative Example 1 is 0.7%/° C., whereas the temperature coefficient in Example 1 is 0.2%/° C., demonstrating lower temperature dependence. In general, an increase in temperature leads to an increase in spectral sensitivity because of increase in absorption coefficient and decrease in bandgap energy. In Example 1, since the spectral sensitivity is sufficiently high even at room temperature, the change of spectral sensitivity due to temperature rise is smaller than in Comparative Example 1.

In the photodiode PD1, the accumulation layer 11 is formed on the second principal surface 1b side of the n⁻ type semiconductor substrate 1. This induces recombination of unnecessary carriers generated independent of light on the second principal surface 1b side, which can reduce dark current. The accumulation layer 11 prevents carriers generated by light near the second principal surface 1b, from being trapped in the second principal surface 1b. For this reason, the carriers generated by light efficiently migrate to the pn junction portion, which can further improve the photodetection sensitivity of the photodiode PD1.

In the first embodiment, after the formation of the accumulation layer 11, the n⁻ type semiconductor substrate 1 is subjected to the thermal treatment. This treatment restores the crystallinity of the n⁻ type semiconductor substrate 1, which can prevent such a problem as increase of dark current.

In the first embodiment, after the thermal treatment of the n⁻ type semiconductor substrate 1, the electrodes 13, 15 are formed. This prevents the electrodes 13, 15 from melting during the thermal treatment, even in the case where the electrodes 13, 15 are made of a metal with a relatively low melting point. Therefore, the electrodes 13, 15 can be appropriately formed without being affected by the thermal treatment.

In the first embodiment, the irregular asperity 10 is formed by the irradiation with the picosecond to femtosecond pulsed laser beam. This permits the irregular asperity 10 to be appropriately and readily formed.

Second Embodiment

Figure 14:
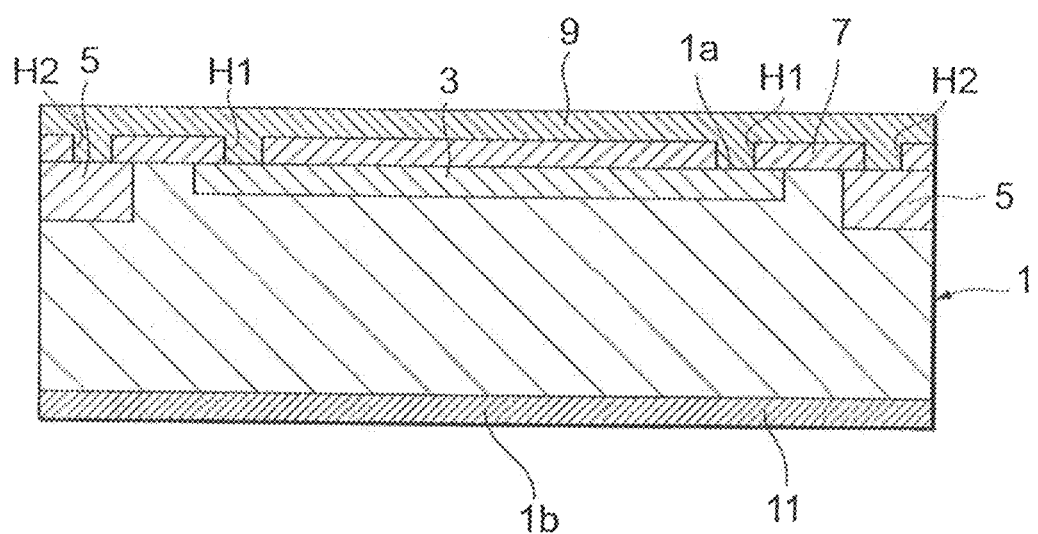
FIG. 14 is a drawing for explaining a manufacturing method of a photodiode according to the second embodiment.
Figure 15:
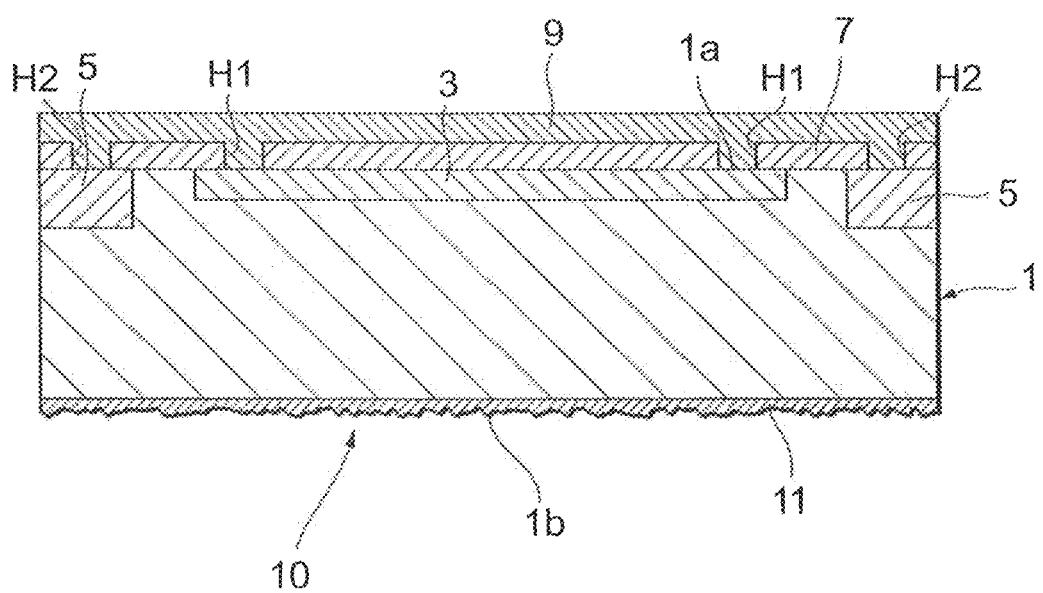
FIG. 15 is a drawing for explaining the manufacturing method of the photodiode according to the second embodiment.
Figure 16:
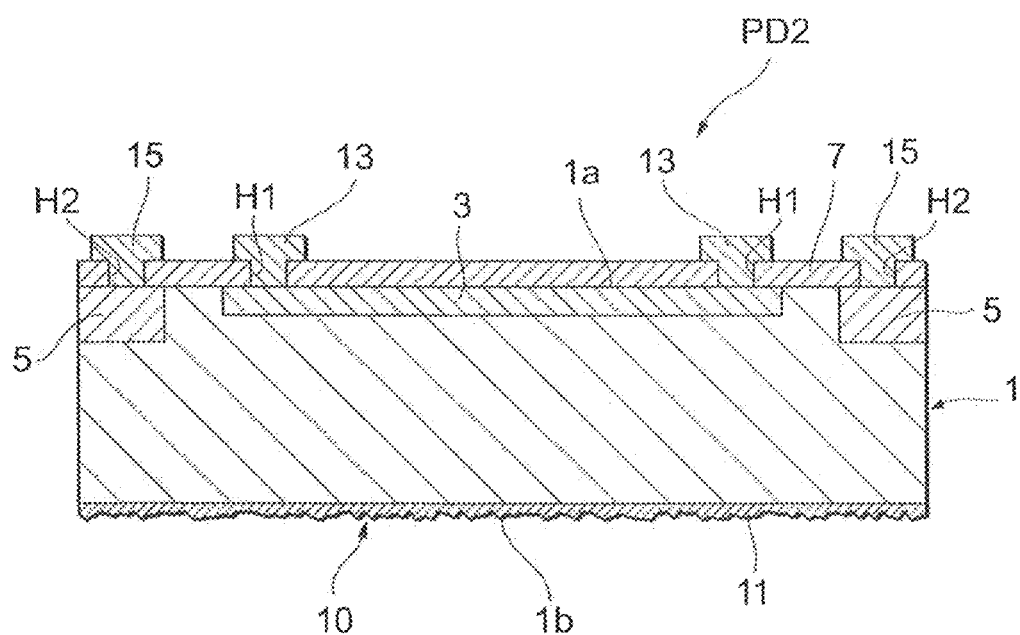
FIG. 16 is a drawing for explaining the manufacturing method of the photodiode according to the second embodiment.
Figure 17:
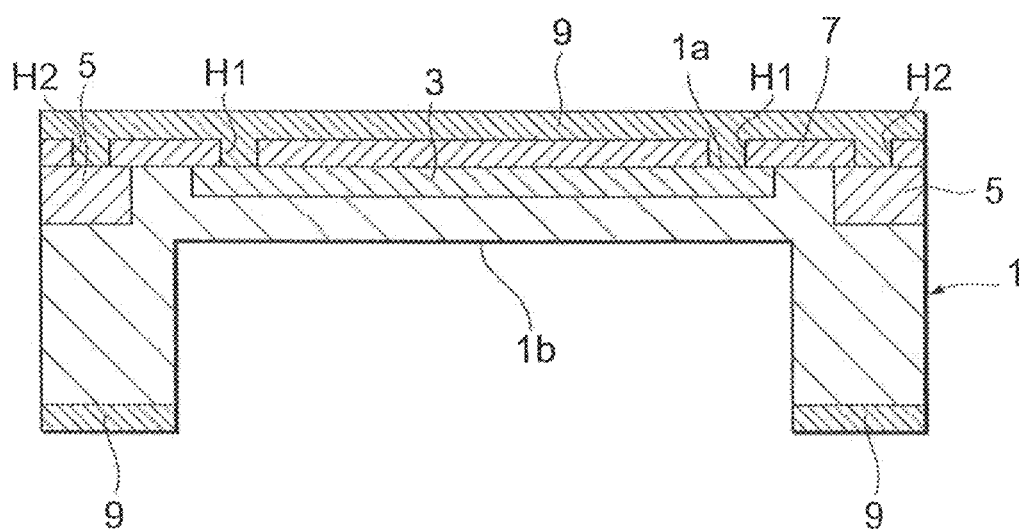
FIG. 17 is a drawing for explaining a manufacturing method of a photodiode according to the third embodiment.

A method for manufacturing a photodiode according to the second embodiment will be described with reference to FIGS. 14 to 16. FIGS. 14 to 16 are drawings for explaining the manufacturing method of the photodiode according to the second embodiment.

The manufacturing method of the second embodiment, up to the polishing of the n⁻ type semiconductor substrate 1 from the second principal surface 1b side, is the same as the manufacturing method of the first embodiment, and the description of the previous steps before it is omitted herein. After the n⁻ type semiconductor substrate 1 is polished from the second principal surface 1b side to obtain the n⁻ type semiconductor substrate 1 in the desired thickness, the accumulation layer 11 is formed on the second principal surface 1b side of the n⁻ type semiconductor substrate 1 (cf. FIG. 14). The formation of the accumulation layer 11 is carried out in the same manner as in the first embodiment. The accumulation layer 11 has the thickness of, for example, about 1 μm.

Next, the second principal surface 1b of the n⁻ type semiconductor substrate 1 is irradiated with the pulsed laser beam PL to form the irregular asperity 10 (cf. FIG. 15). The formation of the irregular asperity 10 is carried out in the same manner as in the first embodiment.

Next, as in the first embodiment, the n⁻ type semiconductor substrate 1 is subjected to a thermal treatment. Thereafter, the passivation layer 9 formed on the insulating layer 7 is removed and then the electrodes 13, 15 are formed (cf. FIG. 16). This completes the photodiode PD2.

In the second embodiment, as in the first embodiment, the travel distance of light incident into the photodiode PD2 also becomes long and the distance of absorption of light also becomes long. This allows the photodiode PD2 also to be improved in the spectral sensitivity characteristic in the red to near-infrared wavelength band.

In the second embodiment, the thickness of the accumulation layer 11 is larger than the height difference of the irregular asperity 10. For this reason, even if the irregular asperity 10 is formed by the irradiation with the pulsed laser beam after the formation of the accumulation layer 11, the accumulation layer 11 remains with certainty. Therefore, it is feasible to ensure the operational effect by the accumulation layer 11.

Third Embodiment

A method for manufacturing a photodiode according to the third embodiment will be described with reference to FIGS. 17 to 21. FIGS. 17 to 21 are drawings for explaining the manufacturing method of the photodiode according to the third embodiment.

The manufacturing method of the third embodiment, up to the formation of the passivation layer 9, is the same as the manufacturing method of the first embodiment, and the description of the previous steps before it is omitted herein. After the formation of the passivation layer 9, a portion corresponding to the $p^+$ type semiconductor region 3 in the $n^-$ type semiconductor substrate 1 is thinned from the second principal surface 1b side while leaving a surrounding region around the thinned portion (cf. FIG. 17). The thinning of the $n^-$ type semiconductor substrate 1 is carried out, for example, by anisotropic etching based on alkali etching using a potassium hydroxide solution, TMAH (tetramethylammonium hydroxide solution), or the like. The thinned portion of the $n^-$ type semiconductor substrate 1 has the thickness of, for example, about 100 µm, and the surrounding region around it has the thickness of, for example, about 300 µm.

Figure 18:
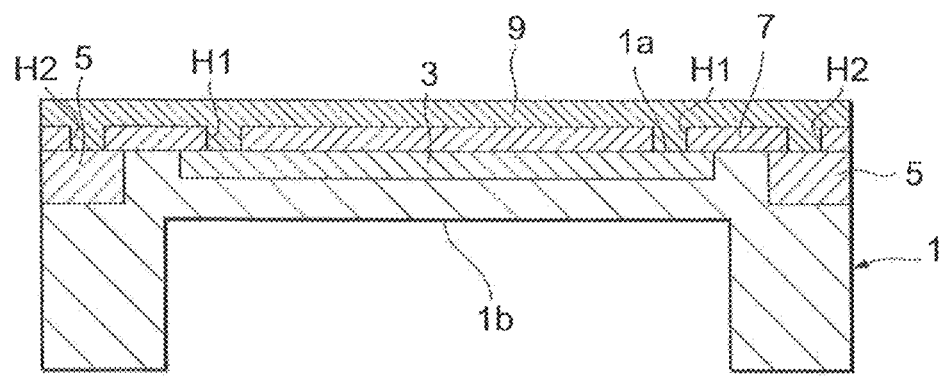
FIG. 18 is a drawing for explaining the manufacturing method of the photodiode according to the third embodiment.

Next, the $n^-$ type semiconductor substrate 1 is polished from the second principal surface 1b side before the thickness of the surrounding region of the $n^-$ type semiconductor substrate 1 reaches a desired thickness (cf. FIG. 18). The desired thickness herein is, for example, 270 µm.

Figure 19:
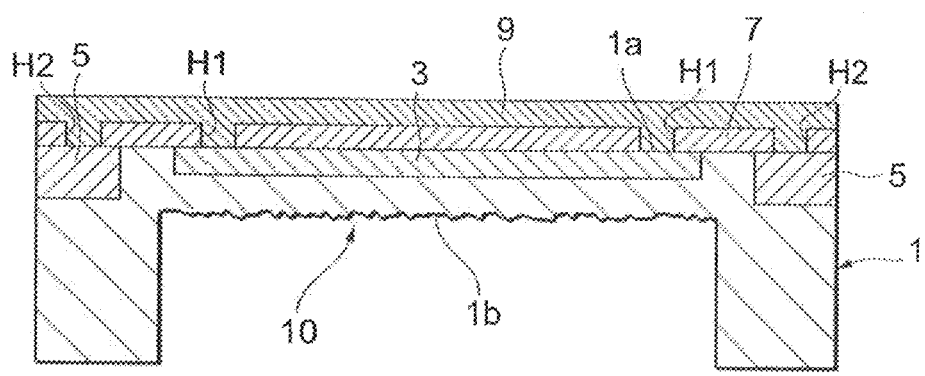
FIG. 19 is a drawing for explaining the manufacturing method of the photodiode according to the third embodiment.

Next, the second principal surface 1b of the $n^-$ type semiconductor substrate 1 is irradiated with the pulsed laser beam PL to form the irregular asperity 10 (cf. FIG. 19). The formation of the irregular asperity 10 is carried out in the same manner as in the first embodiment.

Figure 20:
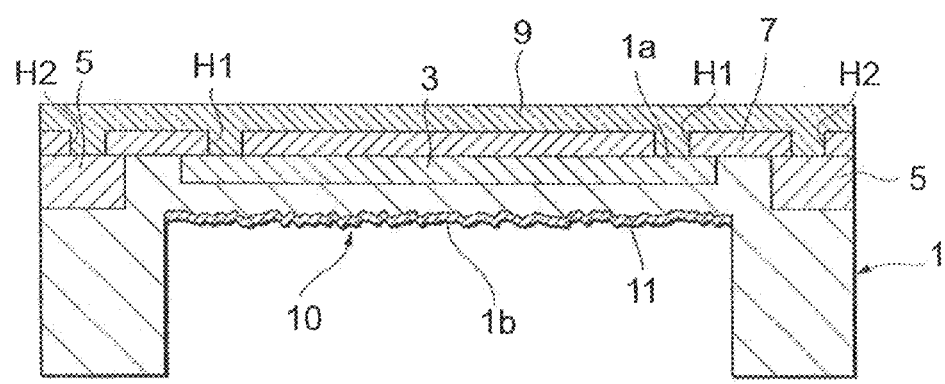
FIG. 20 is a drawing for explaining the manufacturing method of the photodiode according to the third embodiment.

Next, the accumulation layer 11 is formed on the second principal surface 1b side of the thinned portion of the $n^-$ type semiconductor substrate 1 (cf. FIG. 20). The formation of the accumulation layer 11 is carried out in the same manner as in the first embodiment. The accumulation layer 11 has the thickness of, for example, about 3 µm.

Figure 21:
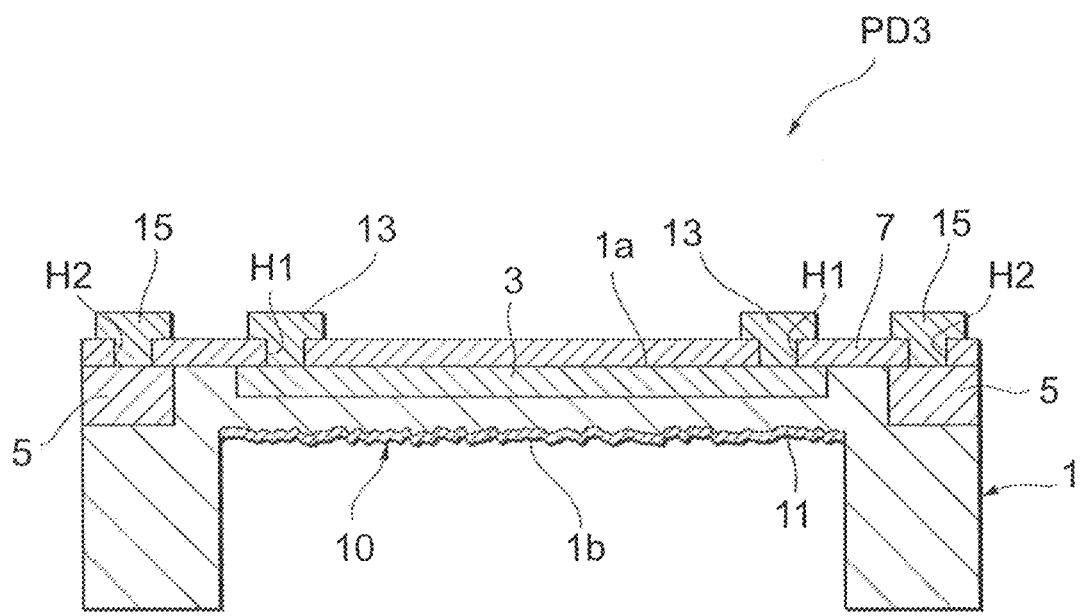
FIG. 21 is a drawing for explaining the manufacturing method of the photodiode according to the third embodiment.

Next, as in the first embodiment, the $n^-$ type semiconductor substrate 1 is subjected to a thermal treatment and thereafter, the passivation layer 9 formed on the insulating layer 7 is removed, followed by formation of the electrodes 13, 15 (cf. FIG. 21). This completes the photodiode PD3.

In the third embodiment, as in the first and second embodiments, the travel distance of light incident into the photodiode PD3 also becomes long and the distance of absorption of light also becomes long. This allows the photodiode PD3 also to be improved in the spectral sensitivity characteristic in the red to near-infrared wavelength band.

In the third embodiment, prior to the formation of the irregular asperity 10, the portion corresponding to the $p^+$ type semiconductor region 3 in the $n^-$ type semiconductor substrate 1 is thinned from the second principal surface 1b side while leaving the surrounding region around the thinned portion. This permits the photodiode PD3 to be formed with respective light incident surfaces on the first principal surface 1a and the second principal surface 1b sides of the $n^-$ type semiconductor substrate 1.

Fourth Embodiment

Figure 22:
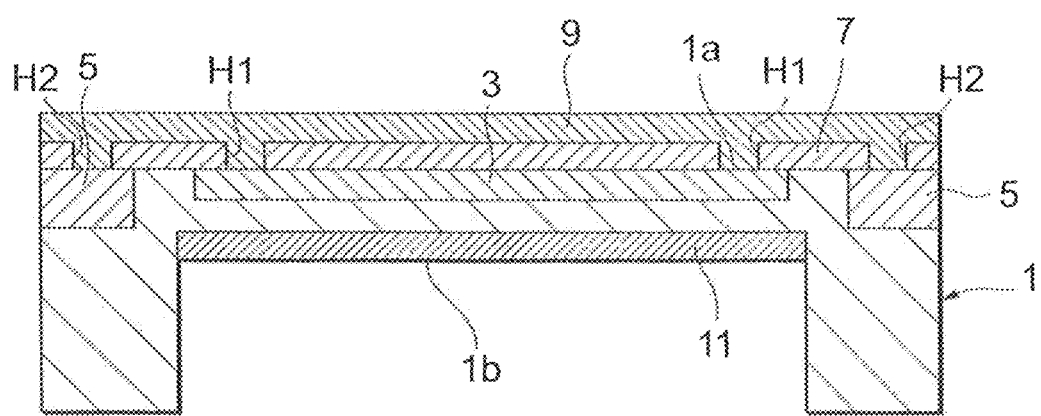
FIG. 22 is a drawing for explaining a manufacturing method of a photodiode according to the fourth embodiment.
Figure 23:
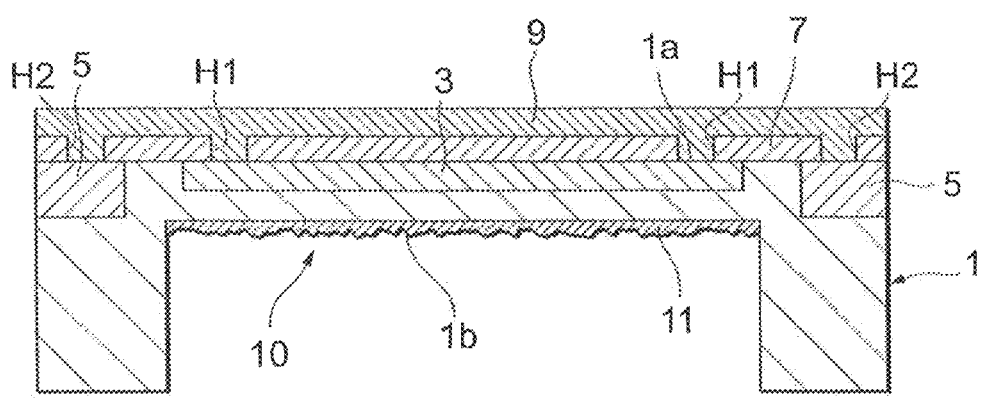
FIG. 23 is a drawing for explaining the manufacturing method of the photodiode according to the fourth embodiment.
Figure 24:
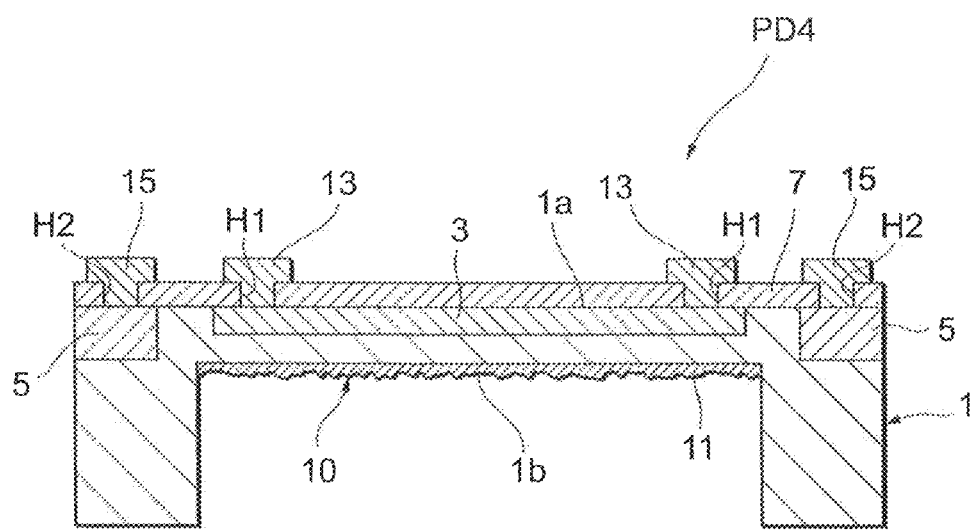
FIG. 24 is a drawing for explaining the manufacturing method of the photodiode according to the fourth embodiment.

A method for manufacturing a photodiode according to the fourth embodiment will be described with reference to FIGS. 22 to 24. FIGS. 22 to 24 are drawings for explaining the manufacturing method of the photodiode according to the fourth embodiment.

The manufacturing method of the fourth embodiment, up to the thinning of the $n^-$ type semiconductor substrate 1, is the same as the manufacturing method of the third embodiment, and the description of the previous steps before it is omitted herein. After the $n^-$ type semiconductor substrate 1 is polished from the second principal surface 1b side to obtain the $n^-$ type semiconductor substrate 1 in the desired thickness, the accumulation layer 11 is formed on the second principal surface 1b side of the thinned portion of the $n^-$ type semiconductor substrate 1 (cf. FIG. 22). The formation of the accumulation layer 11 is carried out in the same manner as in the first embodiment. The accumulation layer 11 has the thickness of, for example, about 3 µm.

Next, the second principal surface 1b of the $n^-$ type semiconductor substrate 1 is irradiated with the pulsed laser beam PL to form the irregular asperity 10 (cf. FIG. 23). The formation of the irregular asperity 10 is carried out in the same manner as in the first embodiment.

Next, the $n^-$ type semiconductor substrate 1 is subjected to a thermal treatment as in the first embodiment. Then the passivation layer 9 formed on the insulating layer 7 is removed and thereafter, the electrodes 13, 15 are formed (cf. FIG. 24). This completes the photodiode PD4.

In the fourth embodiment, as in the first to third embodiments, the travel distance of light incident into the photodiode PD4 also becomes long and the distance of absorption of light also becomes long. This allows the photodiode PD4 also to be improved in the spectral sensitivity characteristic in the red to near-infrared wavelength band.

In the fourth embodiment, prior to the formation of the accumulation layer 11, the portion corresponding to the $p^+$ type semiconductor region 3 in the $n^-$ type semiconductor substrate 1 is thinned from the second principal surface 1b side while leaving the surrounding region around the thinned portion. This permits the photodiode PD4 to be formed with respective light incident surfaces on the first principal surface 1a and the second principal surface 1b sides of the $n^-$ type semiconductor substrate 1.

Fifth Embodiment

Figure 25:
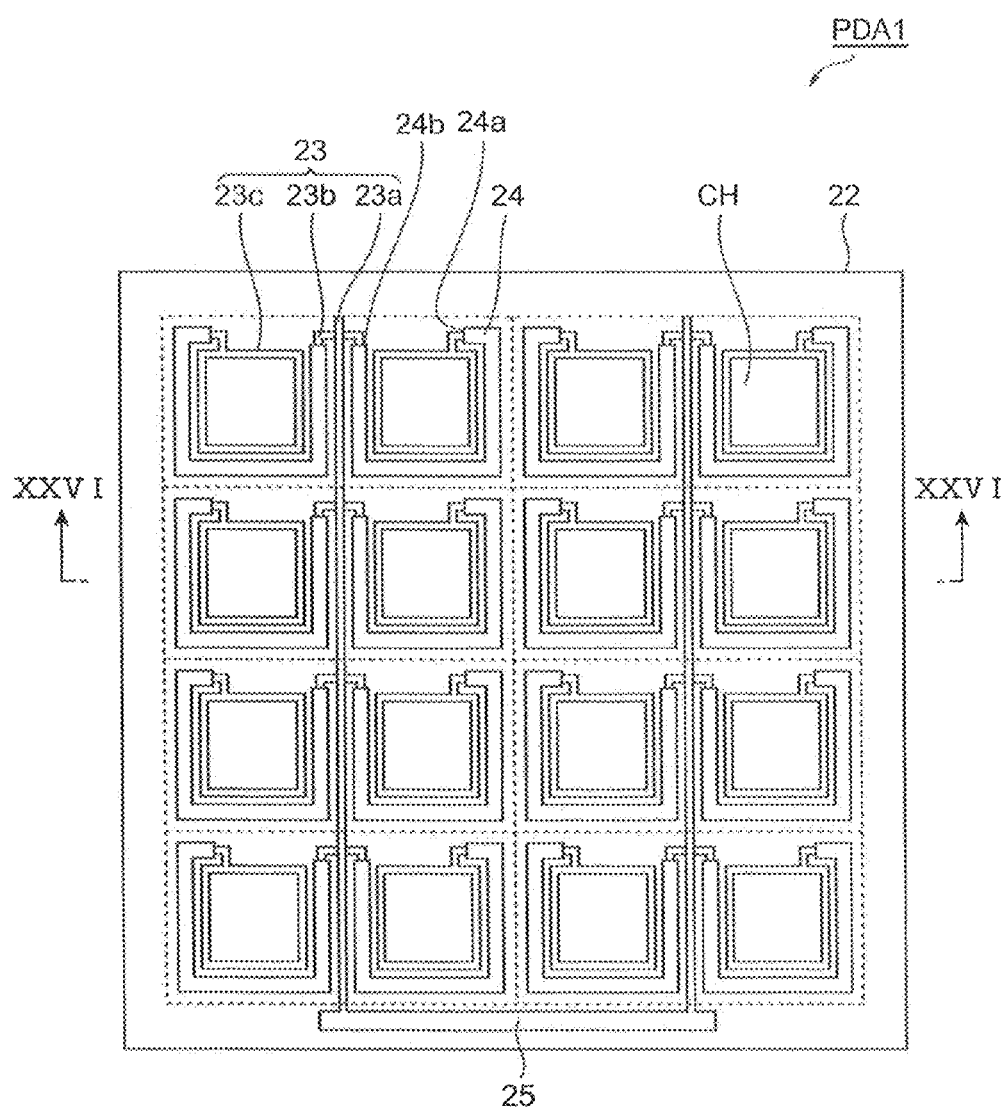
FIG. 25 is a plan view schematically showing a photodiode array according to the fifth embodiment.
Figure 26:
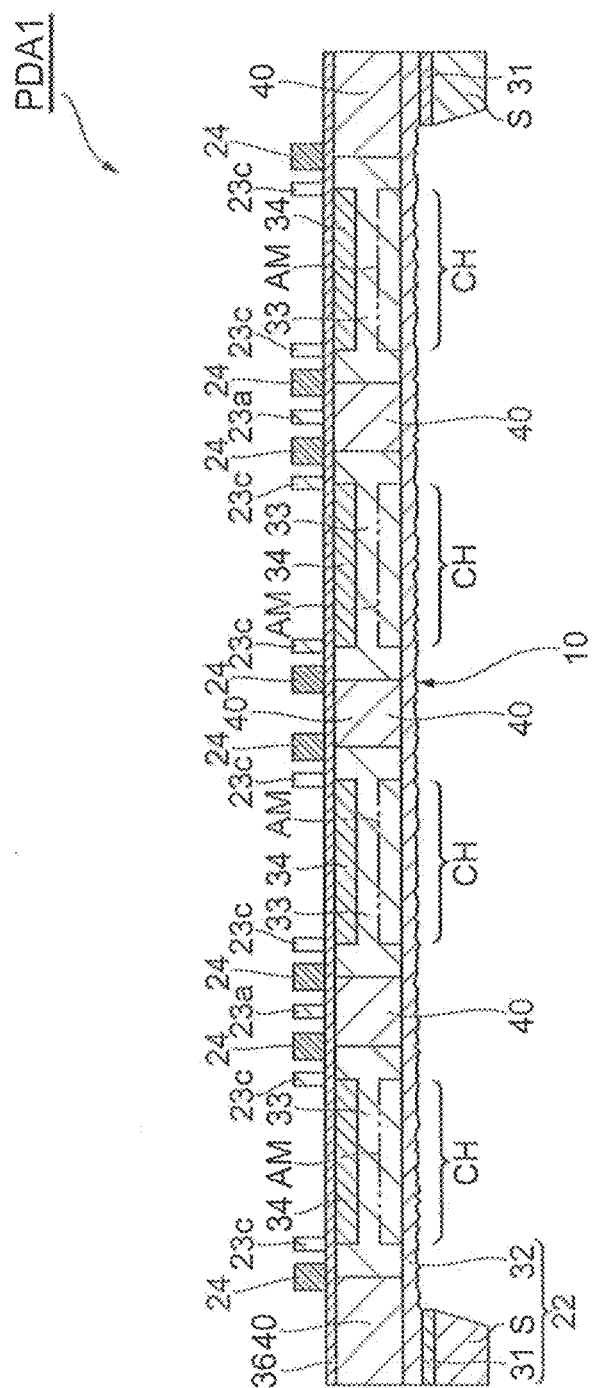
FIG. 26 is a drawing schematically showing a cross-sectional configuration along the line XXVI-XXVI in FIG. 25.

A configuration of a photodiode array PDA1 according to the fifth embodiment will be described with reference to FIGS. 25 and 26. FIG. 25 is a plan view schematically showing the photodiode array PDA1 of the fifth embodiment. FIG. 26 is a drawing showing a cross-sectional configuration along the line XXVI-XXVI of the photodiode array PDA1 shown in FIG. 25.

The photodiode array PDA1 is composed of a plurality of semiconductor layers and an insulating layer layered on a substrate 22. As shown in FIG. 25, the photodiode array PDA1 is a multichannel avalanche photodiode for photon counting in which a plurality of photodetecting channels CH for detection target light to be entered thereinto are formed in a matrix pattern (4×4 in the present embodiment). There are signal conducting wires 23, resistors 24, and an electrode pad 25 provided on the top side of the photodiode array PDA1. The substrate 22 has, for example, a square shape about 1 mm on each side. Each photodetecting channel CH has, for example, a square shape.

The signal conductor wire 23 consists of a readout portion 23a, connecting portions 23b, and channel peripheral portions 23c. The readout portion 23a transfers a signal output from each photodetecting channel CH. The connecting portion 23b connects each resistor 24 and the readout portion 23a. Each channel peripheral portion 23c is routed so as to surround the periphery of the photodetecting channel CH. The readout portion 23a is connected to each of the photodetecting channels CH arranged in two adjacent columns with the readout portion 23a in between, and is connected at one end thereof to the electrode pad 25. Since in the present embodiment the photodiodes are arranged in the 4×4 matrix pattern, there are two readout portions 23a as wiring on the photodiode array PDA1 and these are connected both to the electrode pad 25. The signal conducting wires 23 are comprised, for example, of aluminum (Al).

The resistor 24 is provided for each photodetecting channel CH through one end portion 24a and the channel peripheral portion 23c and is connected through the other end portion 24b and the connecting portion 23b to the readout portion 23a. A plurality of resistors 24 (eight in the present embodiment) connected to an identical readout portion 23a are connected to the readout portion 23a. The resistors 24 are comprised, for example, of polysilicon (Poly-Si).

Next, the cross-sectional configuration of the photodiode array PDA1 will be described with reference to FIG. 26. As shown in FIG. 26, the photodiode array PDA1 is provided with a substrate 22 having a semiconductor layer with the conductivity type of n-type (first conductivity type), a p$^-$ type semiconductor layer 33 with the conductivity type of p-type (second conductivity type) formed on the substrate 22, p$^+$ type semiconductor regions 34 with the conductivity type of p-type formed on the p$^-$ type semiconductor layer 33, a protecting film 36, a separating portion 40 with the conductivity type of n-type (first conductivity type) formed in the p$^-$ type semiconductor layer 33, and the aforementioned signal conducting wires 23 and resistors 24 formed on the protecting film 36. The detection target light is incident from the top side or the bottom side in FIG. 26.

The substrate 22 has a substrate member S, an insulating film 31 formed on the substrate member S, and an n$^+$ type semiconductor layer 32 formed on the insulating film 31. The substrate member S is comprised of Si (silicon). The insulating film 31 is comprised, for example, of SiO$_2$ (silicon oxide). The n$^+$ type semiconductor layer 32 is a semiconductor layer with the conductivity type of n-type comprised of Si and having a high impurity concentration. The thickness of the n$^+$ type semiconductor layer 32 is, for example, 1 μm-12 μm.

The p$^-$ type semiconductor layer 33 is an epitaxial semiconductor layer with the conductivity type of p-type having a low impurity concentration. The p$^-$ type semiconductor layer 33 forms pn junctions at the interface to the substrate 22. The p$^-$ type semiconductor layer 33 has a plurality of multiplication regions AM for avalanche multiplication of carriers generated with incidence of the detection target light, corresponding to the respective photodetecting channels CH. The thickness of the p$^-$ type semiconductor layer 33 is, for example, 3 μm-5 μm. The p$^-$ type semiconductor layer 33 is comprised of Si. Therefore, the n$^+$ type semiconductor layer 32 and the p$^-$ type semiconductor layer 33 constitute a silicon substrate.

The p$^+$ type semiconductor regions 34 are formed on the p$^-$ type semiconductor layer 33, corresponding to the multiplication regions AM of the respective photodetecting channels CH. Namely, each multiplication region AM is a region near the interface to the substrate 22 in the p$^-$ type semiconductor layer 33 located below the p$^+$ type semiconductor region 34 in the lamination direction of semiconductor layers (which will be referred to hereinafter simply as the lamination direction). The p$^+$ type semiconductor regions 34 are comprised of Si.

The separating portion 40 is formed between the plurality of photodetecting channels CH to separate the photodetecting channels CH. Namely, the separating portion 40 is formed so as to form the multiplication regions AM in the p$^-$ type semiconductor layer 33 in one-to-one correspondence to the respective photodetecting channels CH. The separating portion 40 is formed in a two-dimensional lattice pattern on the substrate 22 so as to completely surround the periphery of each multiplication region AM. The separating portion 40 is formed so as to penetrate from the top side to the bottom side of the p$^-$ type semiconductor layer 33 in the lamination direction. The separating portion 40 is a semiconductor layer with the conductivity type of n-type an impurity of which is comprised, for example, of P and an impurity concentration of which is high. If the separating portion 40 is formed by diffusion, a long thermal treatment time will be needed. For this reason, it is considered that the impurity of the n$^+$ type semiconductor layer 32 diffuses into the epitaxial semiconductor layer so as to cause a rise of interfaces of the pn junctions. In order to prevent this rise, the separating portion 40 may be formed in such a manner that a trench is formed by etching near centers of regions corresponding to the separating portion 40 and thereafter performing diffusion of the impurity. The details will be described in another embodiment, but a light shielding portion may be formed in the trench groove by filling the trench groove with a material to absorb or reflect the light in the wavelength band to be absorbed by the photodetecting channels. In this case, it is feasible to prevent crosstalk caused by influence of emission by avalanche multiplication on neighboring photodetecting channels.

The p$^-$ type semiconductor layer 33, p$^+$ type semiconductor regions 34, and separating portion 40 form a flat surface on the top side of the photodiode array PDA1 and the protecting film 36 is formed thereon. The protecting film 36 is made of an insulating layer comprised, for example, of SiO$_2$.

The signal conducting wires 23 and resistors 24 are formed on the protecting film 36. The readout portions 23a of the signal conducting wires 23 and the resistors 24 are formed above the separating portion 40.

The signal conducting wires 23 function as anodes and the photodiode array may be provided with a transparent electrode layer (e.g., a layer comprised of ITO (Indium Tin Oxide)) over the entire surface on the bottom side (the side without the insulating film 31) of the substrate 22, as a cathode though not shown. Alternatively, as a cathode, an electrode portion may be formed so as to be drawn out to the front side.

Figure 27:
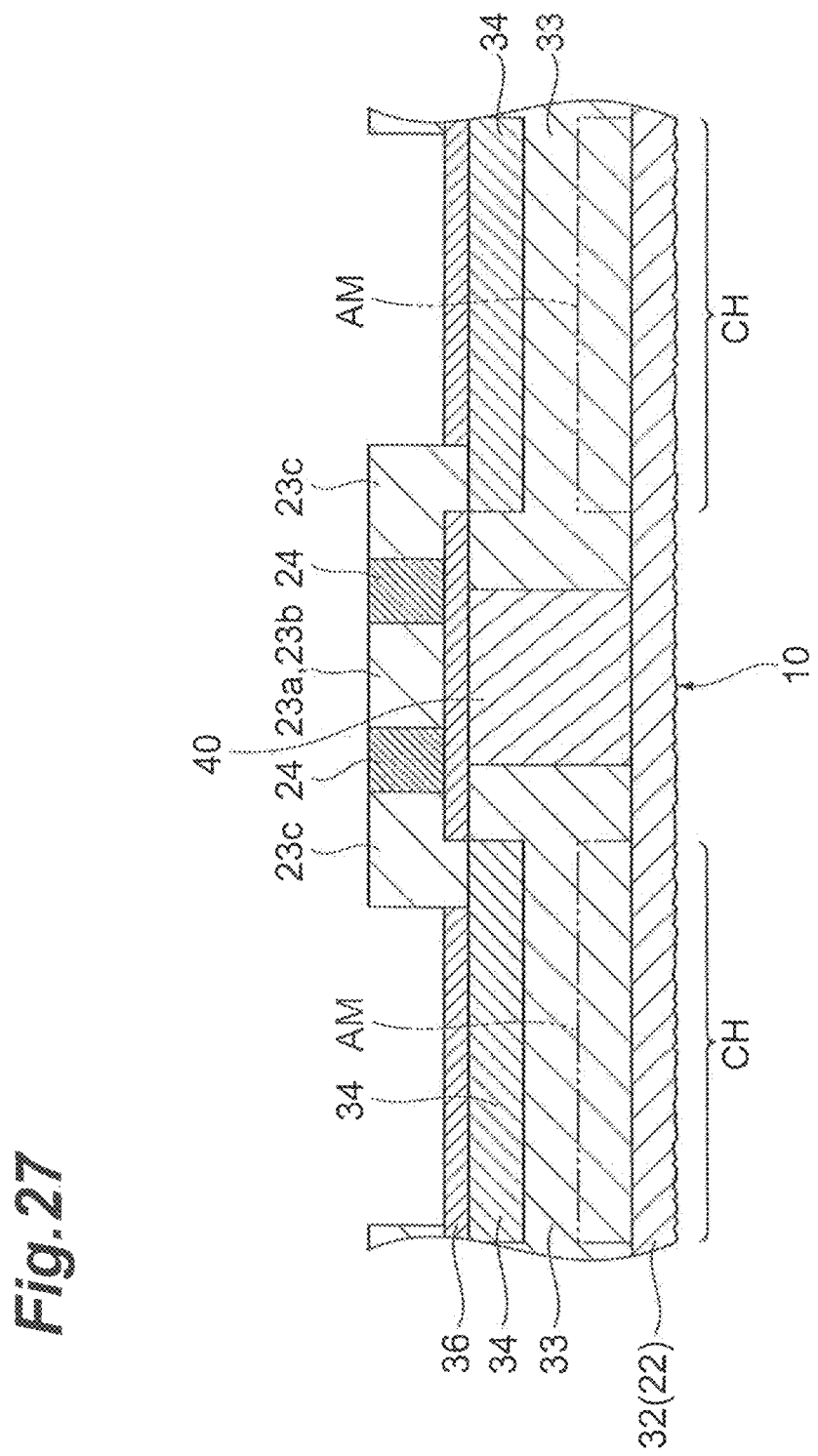
FIG. 27 is a drawing schematically explaining a connection relation of each photodetecting channel with a signal conducting wire and a resistor.

Now, a connection relation of each photodetecting channel CH to the signal conducting wire 23 and resistor 24 will be described with reference to FIG. 27. FIG. 27 is a drawing for schematically explaining the connection relation of each photodetecting channel CH to the signal conducting wire 23 and resistor 24. As shown in FIG. 27, the p$^+$ type semiconductor region 34 of each photodetecting channel CH is directly connected to the signal conducting wire 23 (channel peripheral portion 23c). This establishes electrical connection between the signal conducting wire 23 (channel peripheral portion 23c) and the p⁻ type semiconductor layer 33. The p⁻ type semiconductor layer 33 and one end 24a of the resistor 24 are connected through the signal conducting wire 23 (channel peripheral portion 23c) and the other end 24b of each resistor 24 is connected through the connecting portion 23b to the readout portion 23a.

In the substrate 22, the region where the plurality of photodetecting channels CH are formed is thinned from the substrate member S side, so as to remove a portion corresponding to the region where the plurality of photodetecting channels CH are formed in the substrate member S. The substrate member S exists as a frame portion around the thinned region. By removing the frame portion, the substrate 22 may have a configuration wherein the entire region is thinned, i.e., the whole substrate member S is removed. The removal of the substrate member S can be implemented by etching (e.g., dry etching or the like), polishing, and so on. In the case where the substrate member S is removed by dry etching, the insulating film 31 also functions as an etching stop layer. The insulating film 31 exposed after the removal of the substrate member S is removed as described later.

In the surface of the n⁺ type semiconductor layer 32, the irregular asperity 10 is formed throughout the entire region where the plurality of photodetecting channels CH are formed. The region where the irregular asperity 10 is formed in the surface of the n⁺ type semiconductor layer 32 is optically exposed. That the surface of the n⁺ type semiconductor layer 32 is optically exposed embraces, not only the case where the surface of the n⁺ type semiconductor layer 32 is in contact with ambient gas such as air, but also the case where an optically transparent film is formed on the surface of the n⁺ type semiconductor layer 32. The irregular asperity 10 may also be formed only in the regions opposed to the respective photodetecting channels CH.

The irregular asperity 10 is formed by irradiating the insulating film 31 exposed after the removal of the substrate member S with a pulsed laser beam, in the same manner as in the aforementioned embodiments. Namely, when the exposed insulating film 31 is irradiated with the pulsed laser beam, the insulating film 31 is removed and the surface of the n⁺ type semiconductor layer 32 is roughened by the pulsed laser beam, thereby forming the irregular asperity 10. A pulse laser generating device to irradiate the pulsed laser beam can be a picosecond to femtosecond pulse laser generating device. The irregular asperity 10 has facets intersecting with the direction perpendicular to the surface of the n⁺ type semiconductor layer 32. The height difference of the asperity 10 is, for example, about 0.5-10 μm and the spacing of projections in the asperity 10 is about 0.5-10 μm. The picosecond to femtosecond pulsed laser beam has the pulse duration of, for example, about 50 fs-2 ps, the intensity of, for example, about 4-16 GW, and the pulse energy of, for example, about 200-800 μJ/pulse. More generally, the peak intensity is about $3 \times 10^{11}$-$2.5 \times 10^{13}$ (W/cm²) and the fluence about 0.1-1.3 (J/cm²).

After the formation of the irregular asperity 10 by irradiation with the pulsed laser beam, the substrate 22 is preferably subjected to a thermal treatment (anneal). For example, the substrate 22 is heated in the temperature range of about 800 to 1000° C. in an ambiance of $N_2$ gas or the like for about 0.5 to 1.0 hour. The foregoing thermal treatment restores the crystallinity of the n⁺ type semiconductor layer 32 and thus prevents the problem such as increase of dark current.

When the photodiode array PDA1 configured as described above is used for photon counting, it is operated under an operation condition called a Geiger mode. In this Geiger mode operation, a reverse voltage (e.g., 50 V or more) higher than the breakdown voltage is applied to each photodetecting channel CH. When the detection target light is incident from the top side into each photodetecting channel CH in this state, the target light is absorbed in each photodetecting channel CH to generate a carrier. The generated carrier migrates as accelerated according to an electric field in each photodetecting channel CH to be multiplied in each multiplication region AM. Then the multiplied carriers are taken out through the resistor 24 and through the signal conducting wire 23 to the outside to be detected based on a wave height value of an output signal thereof. Since every channel detecting a photon provides the same quantity of output, the total output from all the channels is detected, thereby counting how many photodetecting channels CH in the photodiode array PDA1 provided the output. Therefore, the photodiode array PDA1 accomplishes the photon counting by the single irradiation operation with the detection target light.

Incidentally, the irregular asperity 10 is formed in the surface of the n⁺ type semiconductor layer 32 in the photodiode array PDA1. For this reason, the light incident into the photodiode array PDA1 is reflected, scattered, or diffused by the asperity 10 to travel through a long distance in the photodiode array PDA1.

For example, in the case where the photodiode array PDA1 is used as a front-illuminated type photodiode array and where the light is incident from the protecting film 36 side into the photodiode array PDA1, when the light reaches the irregular asperity 10 formed in the surface of the n⁺ type semiconductor layer 32, light components arriving thereat at angles of not less than 16.6° to the direction of emergence from the asperity 10 are totally reflected by the asperity 10. Since the asperity 10 is formed irregularly, it has various angles relative to the emergence direction and the totally reflected light components diffuse into various directions. For this reason, the totally reflected light components include light components absorbed in each photodetecting channel CH and light components reaching the surface on the protecting film 36 side and the side faces of the n⁺ type semiconductor layer 32.

The light components reaching the surface on the protecting film 36 side and the side faces of the n⁺ type semiconductor layer 32 travel in various directions because of the diffusion on the asperity 10. For this reason, the light components reaching the surface on the protecting film 36 side and the side faces of the n⁺ type semiconductor layer 32 are extremely highly likely to be totally reflected on the surface on the protecting film 36 side and the side faces of the n⁺ type semiconductor layer 32. The light components totally reflected on the surface on the protecting film 36 side and the side faces of the n⁺ type semiconductor layer 32 are repeatedly totally reflected on different faces, to further increase their travel distance. While the light incident into the photodiode array PDA1 travels through the long distance inside the photodiode array PDA1, it is absorbed in each photodetecting channel CH to be detected as a photocurrent.

In the case where the photodiode array PDA1 is used as a back-thinned type photodiode array and where the light is incident from the front surface side of the n⁺ type semiconductor layer 32 into the photodiode array PDA1, the incident light is scattered by the asperity 10 and travels in various directions in the photodiode array PDA1. The light components reaching the surface on the protecting film 36 side and the side faces of the n⁺ type semiconductor layer 32 travel in various directions because of the diffusion on the asperity 10. For this reason, the light components reaching the surface on the protecting film 36 side and the side faces of the n⁺ type semiconductor layer 32 are extremely highly likely to be totally reflected on each surface. The light components totally reflected on the surface on the protecting film 36 side and the side faces of the n⁺ type semiconductor layer 32 are repeatedly totally reflected on different faces and reflected, scattered, or diffused on the asperity 10, to further increase their travel distance. The light incident into the photodiode array PDA1 is reflected, scattered, or diffused by the asperity 10 to travel through the long distance in the photodiode array PDA1, and to be absorbed in each photodetecting channel CH to be detected as a photocurrent.

The light L incident into the photodiode array PDA1 mostly travels through the long travel distance to be absorbed in each photodetecting channel CH, without passing through the photodiode array PDA1. Therefore, the photodiode array PDA1 is improved in the spectral sensitivity characteristic in the red to near-infrared wavelength band.

In the fifth embodiment, the irregular asperity 10 is formed in the surface of the n⁺ type semiconductor layer 32. For this reason, it induces recombination of unnecessary carriers generated independent of light on the surface side where the irregular asperity 10 is formed, so as to reduce the dark current. The n⁺ type semiconductor layer 32 functions as an accumulation layer to prevent carriers generated by light near the surface of the n⁺ type semiconductor layer 32 from being trapped in the surface. For this reason, the carriers generated by light efficiently migrate to the multiplication regions AM, so as to improve the photodetection sensitivity of the photodiode array PDA1.

In the fifth embodiment, the irregular asperity 10 is also formed in the surface corresponding to the regions between the plurality of photodetecting channels CH in the n⁺ type semiconductor layer 32 and the surface is optically exposed. For this reason, light incident into the regions between the plurality of photodetecting channels CH is also reflected, scattered, or diffused by the irregular asperity 10 to be absorbed in any one of the photodetecting channels CH. Therefore, the detection sensitivity is not lowered in the regions between the photodetecting channels CH, whereby the photodetection sensitivity of the photodiode array PDA1 is further improved. Incidentally, the plurality of photodetecting channels CH are formed in the fifth embodiment, but each photodetecting channel CH is not one to detect a position of incidence of light and the output of the array is the sum of outputs of the respective photodetecting channels CH. For this reason, crosstalk between the photodetecting channels CH does not matter, and the point is that incident light is detected by any one of the photodetecting channels CH.

In the fifth embodiment, the thickness of the n⁺ type semiconductor layer 32 is larger than the height difference of the irregular asperity 10. For this reason, it is feasible to certainly ensure the operational effect as an accumulation layer by the n⁺ type semiconductor layer 32.

In the photodiode array PDA1, the pn junctions are composed of the n⁺ type semiconductor layer 32 of the substrate 22 and the p⁻ type semiconductor layer 33 being the epitaxial semiconductor layer formed on the n⁺ type semiconductor layer 32 of the substrate 22. The multiplication regions AM are formed in the p⁻ type semiconductor layer 33 where the pn junctions are substantialized, and the correspondence of each multiplication region AM to each photodetecting channel CH is realized by the separating portion 40 formed between the photodetecting channels CH. A pn junction surface is composed of an interface between the n⁺ type semiconductor layer 32 and the p⁻ type semiconductor layer 33 and an interface between the separating portion 40 and the p⁻ type semiconductor layer 33. For this reason, the high-concentration impurity regions are convex and there is no region having a high electric field. Therefore, the photodiode array PDA1 has no ends (edges) of pn junctions where edge breakdown occurs in the Geiger mode operation. For this reason, the photodiode array PDA1 does not have to be provided with a guard ring for the pn junction of each photodetecting channel CH. This enables the photodiode array PDA1 to have a drastically high aperture rate.

By achieving the high aperture rate, it also becomes feasible to increase the detection efficiency of the photodiode array PDA1.

Since the photodetecting channels CH are separated by the separating portion 40, it becomes feasible to well suppress crosstalk.

Even if in the Geiger mode operation a large voltage difference is made between a photodetecting channel with incidence of a photon and a channel without incidence, the channels can be separated well because the separating portion 40 is formed between the photodetecting channels CH.

Since in the photodiode array PDA1 the readout portions 23a of the signal conducting wires 23 are formed above the separating portion 40, the signal conducting wires 23 are prevented from crossing above the multiplication regions AM, i.e., above the photodetection surface. For this reason, the aperture rate is more increased. Furthermore, it is considered to be also effective to suppression of dark current. In the photodiode array PDA1, the aperture rate is still more increased because the resistors 24 are also formed above the separating portion 40.

The inventor of the present application discovered from wavelength dependence of after pulse that in the case where the n-type semiconductor substrate was used and the p-type epitaxial semiconductor layer was formed thereon, some of holes generated in the n-type semiconductor substrate went late into the multiplication region to produce an after pulse. In view of this problem, the photodiode array PDA1 is constructed by removing the substrate member S from the region where the plurality of photodetecting channels CH are formed, so as to suppress the after pulse.

Figure 28:
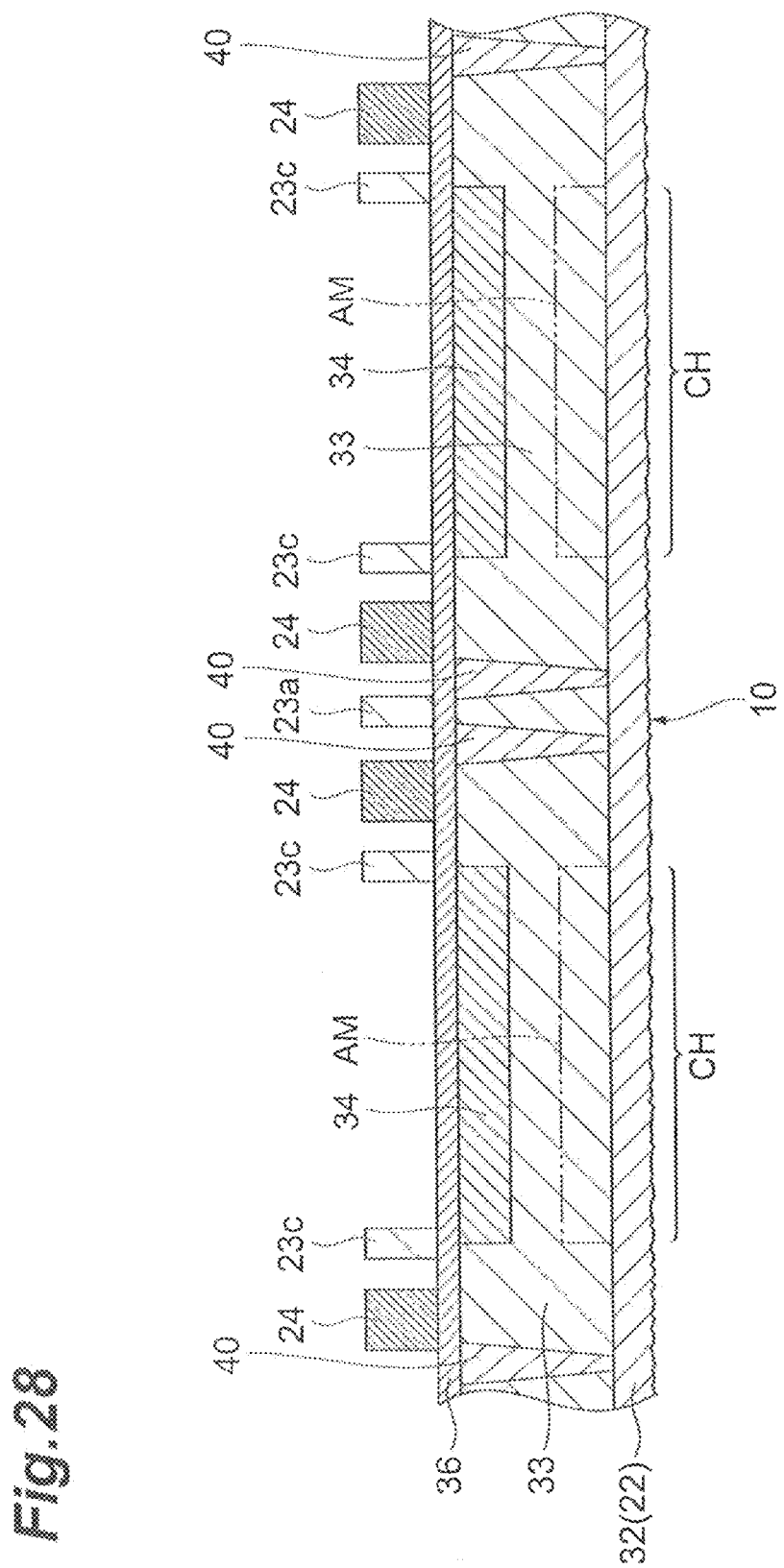
FIG. 28 is a drawing schematically showing a cross-sectional configuration of a first modification example of the photodiode array of the fifth embodiment.

A variety of modifications can be applied to the separating portion 40 in the fifth embodiment. FIG. 28 is a drawing schematically showing a cross-sectional configuration of a first modification example of the photodiode array PDA1 of the fifth embodiment. In the photodiode array of the first modification example, a plurality of separating portions 40 (two in the present modification example) are formed between the photodetecting channels CH.

Figure 29:
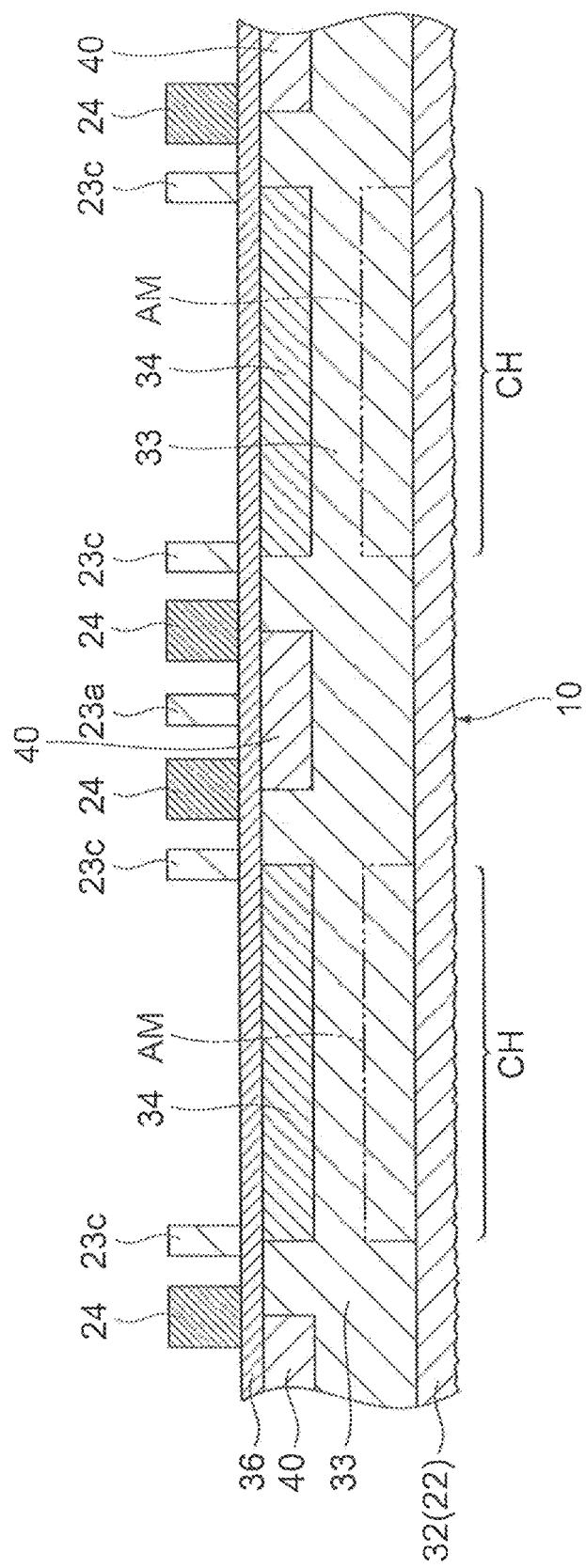
FIG. 29 is a drawing schematically showing a cross-sectional configuration of a second modification example of the photodiode array of the fifth embodiment.

FIG. 29 is a drawing schematically showing a cross-sectional configuration of a second modification example of the photodiode array PDA1 of the present embodiment. In the photodiode array of the second modification example, the separating portion 40 is formed only in the vicinity of the top surface (detection target light incident surface) without penetrating from the top side to the bottom side of the p⁻ type semiconductor layer 33 in the lamination direction.

The above embodiment showed the configuration wherein the epitaxial semiconductor layer had the second conductivity type, but it is also possible to adopt a configuration wherein the epitaxial semiconductor layer has the first conductivity type, second conductivity type semiconductor regions are provided in the semiconductor layer, and the pn junctions are composed of the first conductivity type epitaxial semiconductor layer and the second conductivity type semiconductor regions.

Figure 39:
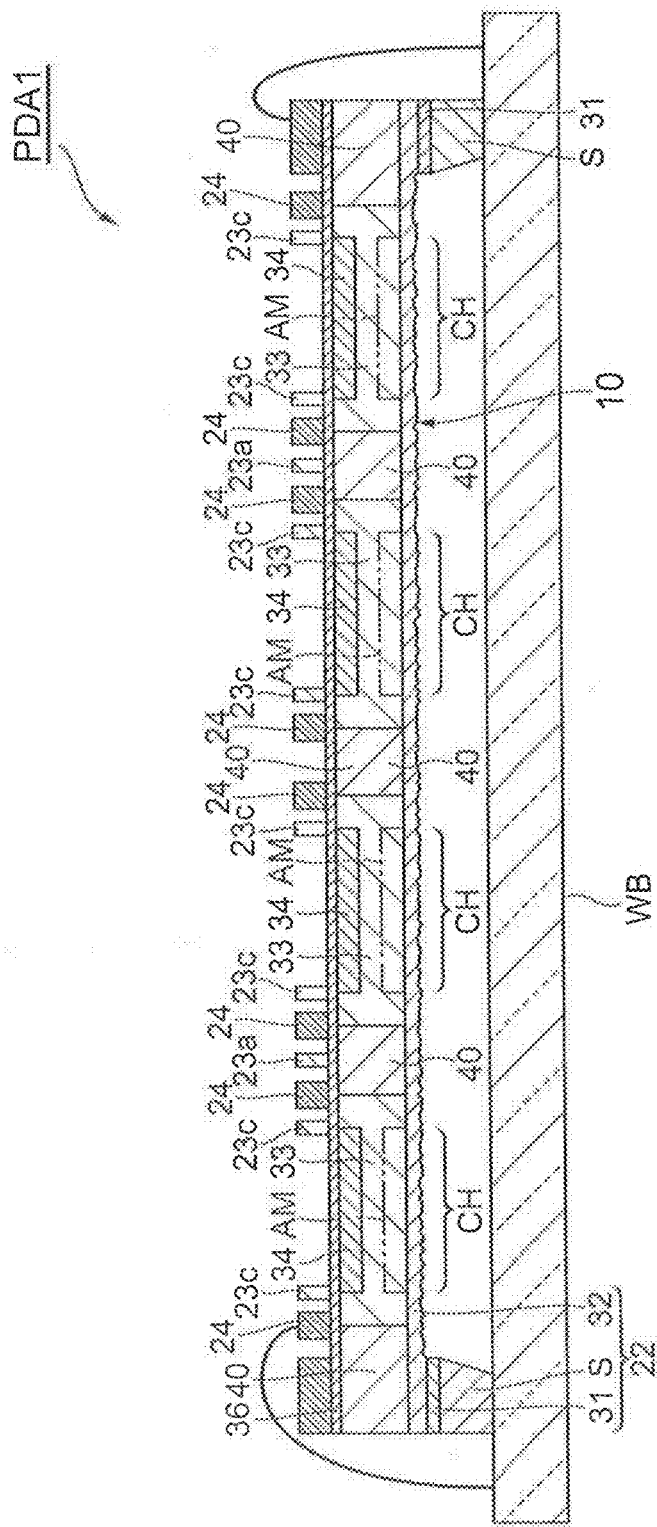
FIG. 39 is a drawing schematically showing an example of a mounted structure of a photodiode array.
Figure 40:
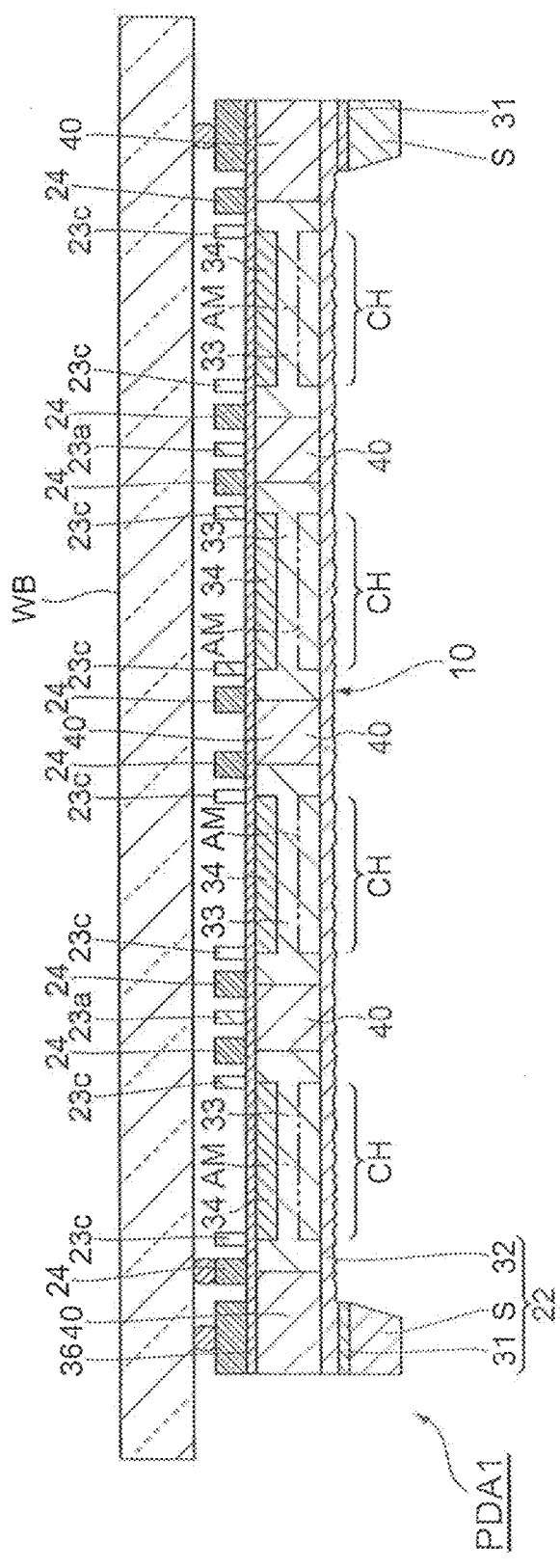
FIG. 40 is a drawing schematically showing an example of a mounted structure of a photodiode array.

The photodiode array PDA1 is mounted on a board WB as shown in FIGS. 39 and 40. In FIG. 39, the photodiode array PDA1 is fixed to the board WB by bonding or the like and is electrically connected to wiring formed on the board WB by wire bonding. In FIG. 40, the photodiode array PDA1 is fixed to a board WB and electrically connected to wiring formed on the board WB by bumps. In the case where the photodiode array PDA1 is connected to the board WB by bumps, it is preferable to fill the region between the photodiode array PDA1 and the board WB with an underfill resin. In this case, it is feasible to ensure the connection strength between the photodiode array PDA1 and the board WB.

In FIG. 39, when the photodiode array PDA1 is used as a back-thinned type photodiode array, the board WB is preferably optically transparent. Likewise, in FIG. 40, when the photodiode array PDA1 is used as a front-illuminated type photodiode array, the board WB is also preferably optically transparent. In this case, the underfill resin to be filled is also preferably optically transparent.

Sixth Embodiment

Figure 30:
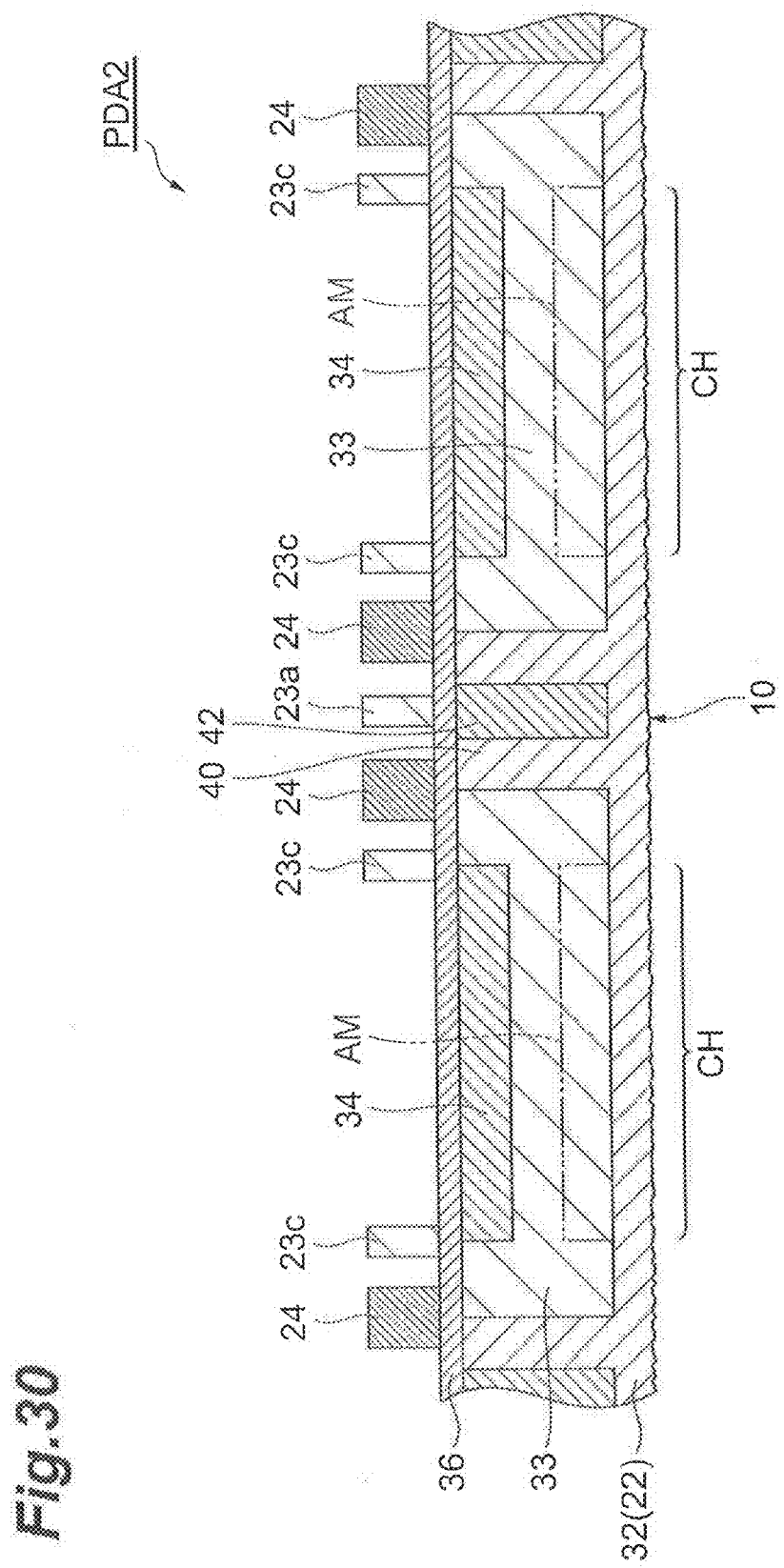
FIG. 30 is a drawing schematically showing a cross-sectional configuration of a photodiode array according to the sixth embodiment.

A configuration of a photodiode array PDA2 according to the sixth embodiment will be described with reference to FIG. 30. FIG. 30 is a drawing schematically showing a cross-sectional configuration of the photodiode array PDA2 of the sixth embodiment. The photodiode array PDA2 of the sixth embodiment is different from the photodiode array PDA1 of the fifth embodiment in that the separating portion 40 has a light shielding portion.

As shown in FIG. 30, the separating portion 40 includes the light shielding portion 42 comprised of a material to absorb light in the wavelength band of detection target light (from visible to near infrared) to be detected by the photodetecting channels CH. The light shielding portion 42 is formed so as to be embedded in the separating portion 40 like a core extending from the top side to the bottom side of the p⁻ type semiconductor layer 33. The light shielding portion 42 is comprised, for example, of a black photoresist obtained by mixing a black dye or a pigment such as insulated carbon black in a photoresist, or a metal such as tungsten. However, in the case where the material making up the light shielding portion 42 is not an insulating material (e.g., the metal such as tungsten), the light shielding portion 42 needs to be coated with an insulating film such as $SiO_2$. As also described in the fifth embodiment, if the separating portion 40 is formed by diffusion the long thermal treatment time is needed; therefore, it is considered that the impurity of the n⁺ type semiconductor layer 32 diffuses into the epitaxial semiconductor layer to cause the rise of the interfaces of the pn junctions. In order to prevent this rise, the separating portion 40 may be formed by forming a trench near the centers of the regions corresponding to the separating portion 40 by etching and thereafter performing diffusion of the impurity. As shown in FIG. 30, after execution of the impurity diffusion, the n⁺ type semiconductor layer 32 and the separating portion 40 become continuous. The light shielding portion may also be formed by filling the remaining trench groove with a material to absorb the light in the wavelength band to be absorbed by the photodetecting channels as described above (or a material to reflect the light in the wavelength band to be absorbed by the photodetecting channels, as described below). This can prevent the crosstalk caused by influence of emission by avalanche multiplication on neighboring photodetecting channels.

In the sixth embodiment, as in the fifth embodiment, the travel distance of the light incident into the photodiode array PDA2 becomes long and the distance of absorption of light also becomes long. This allows the photodiode array PDA2 also to be improved in the spectral sensitivity characteristic in the red to near-infrared wavelength band. Furthermore, the dark current is reduced and the photodetection sensitivity of the photodiode array PDA2 is also improved.

In the photodiode array PDA2, as in the photodiode array PDA1, there is no ends (edges) of the pn junctions to cause edge breakdown in the Geiger mode operation. For this reason, the photodiode array PDA2 does not have to be provided with a guard ring for the pn junction of each photodetecting channel CH, either. This allows the photodiode array PDA2 to have a higher aperture rate.

When the aperture rate is higher, it also becomes feasible to increase the detection efficiency of the photodiode array PDA2.

Since the photodetecting channels CH are separated by the separating portion 40, it is feasible to well suppress the crosstalk.

Since the readout portions 23a of the signal conducting wires 23 are also formed above the separating portion 40 in the photodiode array PDA2, the aperture rate is more improved. Furthermore, it is considered to be also effective to suppression of dark current.

Each separating portion 40 includes the light shielding portion 42 comprised of the material to absorb the light in the wavelength band of the detection target light to be detected by the photodetecting channels CH. Therefore, the light shielding portion absorbs the detection target light, and thus it becomes feasible to well suppress occurrence of crosstalk. The light shielding portion 42 is comprised of a material that absorbs light in the wavelength band of the detection target light to be detected by the photodetecting channels CH, particularly, in the visible to near-infrared wavelength band generated by avalanche multiplication, in order to prevent the light generated by avalanche multiplication from affecting the neighboring photodetecting channels CH. For this reason, it becomes feasible to well suppress occurrence of crosstalk.

The light shielding portion 42 does not have to be limited to the material that absorbs the light in the visible to near-infrared band, but may be a material that reflects the light in the visible to near-infrared band. In this case, the light shielding portion reflects the detection target light and thus it becomes feasible to well suppress occurrence of crosstalk. The light shielding portion 42 is comprised of the material that reflects light in the wavelength band of the detection target light to be detected by the photodetecting channels CH, particularly, in the visible to near-infrared wavelength band generated by avalanche multiplication, in order to prevent the light generated by avalanche multiplication from affecting the neighboring photodetecting channels CH. For this reason, it becomes feasible to well suppress occurrence of crosstalk.

The light shielding portion 42 does not have to be limited to the material absorbing or reflecting the light in the visible to near-infrared band, but may be any material that absorbs or reflects light in the wavelength band of the detection target light to be detected by the photodetecting channels CH. However, the light shielding portion 42 is preferably comprised of a material that absorbs or reflects light in the wavelength band of the detection target light to be detected by the photodetecting channels CH, particularly, in the visible to near-infrared wavelength band generated by avalanche multiplication, in order to prevent the light generated by avalanche multiplication from affecting the neighboring photodetecting channels CH.

The light shielding portion 42 may be comprised of a material with the refractive index lower than that of the separating portion 40. In this case, the light is also reflected by the light shielding portion and thus it becomes feasible to well suppress occurrence of crosstalk.

Seventh Embodiment

Figure 31:
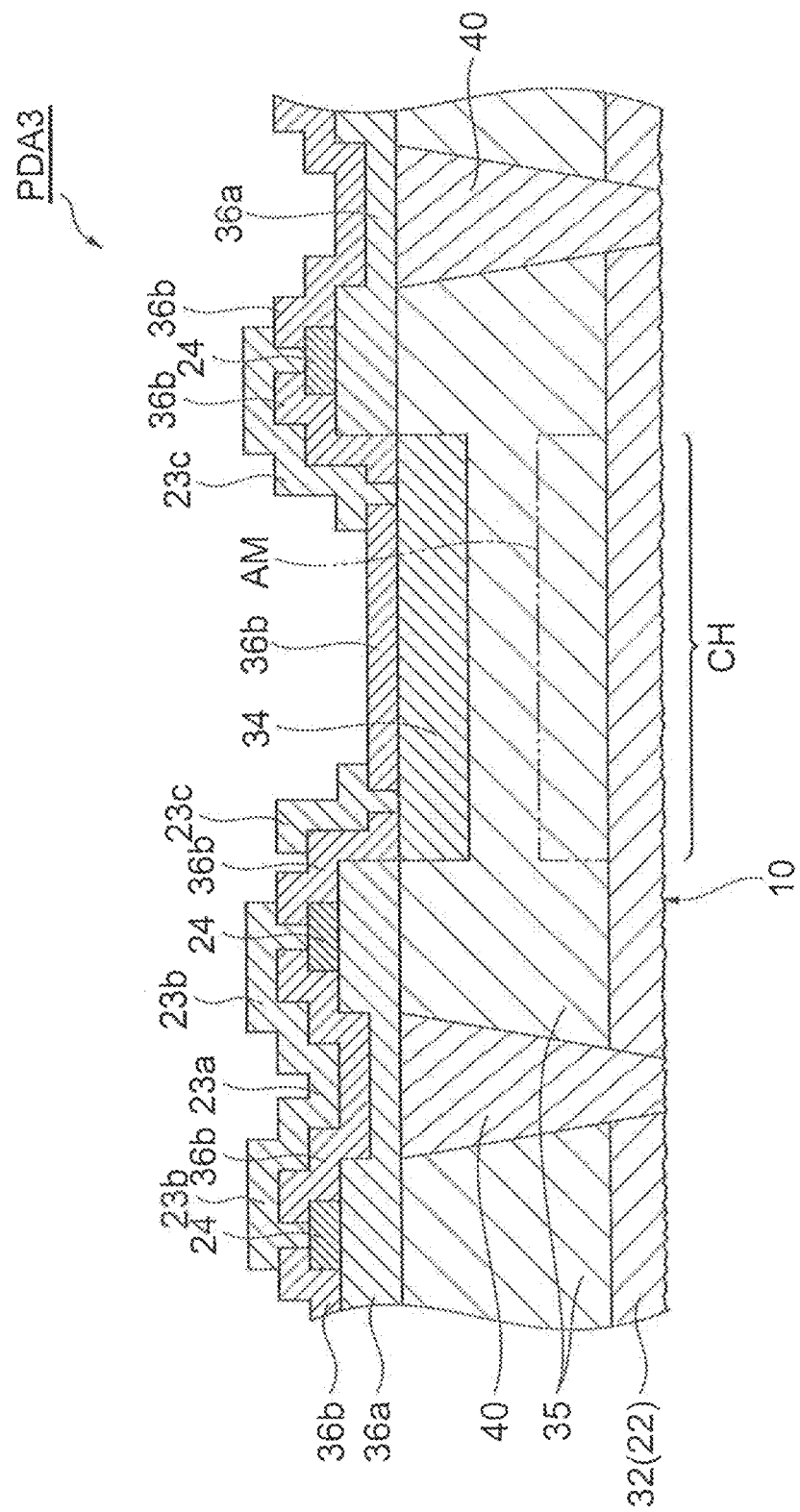
FIG. 31 is a drawing schematically showing a cross-sectional configuration of a photodiode array according to the seventh embodiment.

A configuration of a photodiode array PDA3 according to the seventh embodiment will be described with reference to FIG. 31. FIG. 31 is a drawing for schematically explaining a cross-sectional configuration of the photodiode array PDA3 of the seventh embodiment. The photodiode array PDA3 of the seventh embodiment is different from the photodiode array PDA1 of the fifth embodiment in that the signal conducting wires 23 are formed on a silicon nitride film.

As shown in FIG. 31, the photodiode array PDA3 is provided with a substrate 22 having a semiconductor layer with the conductivity type of n-type (first conductivity type), a p-type semiconductor layer 35 with the conductivity type of p-type (second conductivity type) formed on the substrate 22, $p^+$ type semiconductor regions 34 with the conductivity type of p-type formed on the p-type semiconductor layer 35, protecting films 36a, 36b, a separating portion 40 with the conductivity type of n-type (first conductivity type) formed in the p-type semiconductor layer 35, signal conducting wires 23 of aluminum, and resistors 24, for example, of Ply-Si.

The substrate 22 has an $n^+$ type substrate member (not shown), and an n-type semiconductor layer 32 formed on the substrate member.

The p-type semiconductor layer 35 is an epitaxial semiconductor layer with the conductivity type of p-type having an impurity concentration lower than that of the $p^+$ type semiconductor regions 34. The p-type semiconductor layer 35 forms pn junctions at its interface to the n-type semiconductor layer 32 of the substrate 22. The p-type semiconductor layer 35 has a plurality of multiplication regions AM for avalanche multiplication of carriers generated with incidence of detection target light, corresponding to the respective photodetecting channels CH. The p-type semiconductor layer 35 is comprised of Si.

The p-type semiconductor layer 35, $p^+$ type semiconductor regions 34, and separating portion 40 form a flat surface on the top side of the photodiode array PDA3 and the protecting films 36a, 36b are formed thereon. The protecting film 36a is comprised of an insulating film of silicon oxide film ($SiO_2$ film) and the protecting film 36b is comprised of an insulating film of silicon nitride (SiN film or $Si_3N_4$ film).

As shown in FIG. 31, the protecting film 36a, resistors 24, protecting film 36b, and signal conducting wires 23 are layered in this order on the separating portion 40. Specifically, the protecting film 36a is layered on the separating portion 40. The resistors 24 are layered on the protecting film 36a. The protecting film 36b is layered except for a part of each resistor 24 on the protecting film 36a and on the resistors 24. The signal conducting wires 23 are layered for electrical connection, on the protecting film 36b and the parts of resistors 24 on which the protecting film 36b is not layered. Specifically, a readout portion 23a of the signal conducting wire 23 is layered between resistors 24, and the signal conducting wire 23 as an electrical connection to the connecting portion 23b or the channel peripheral portion 23c is layered for electrical connection on each resistor 24.

As shown in FIG. 31, the protecting film 36b is layered except for a part on each $p^+$ type semiconductor region 34. The channel peripheral portion 23c of the signal conducting wire 23 for electrical connection is layered on the part of the $p^+$ type semiconductor region 34 without deposition of the protecting film 36b and on the part of the protecting film 36b layered on the $p^+$ type semiconductor region 34.

In the seventh embodiment, as in the fifth and sixth embodiments, the travel distance of the light incident into the photodiode array PDA3 becomes long and the distance of absorption of light also becomes long. This allows the photodiode array PDA3 also to be improved in the spectral sensitivity characteristic in the red to near-infrared wavelength band. Furthermore, the dark current is reduced and the photodetection sensitivity of the photodiode array PDA3 is improved.

The photodiode array PDA3, like the photodiode array PDA1, has no ends (edges) of the pn junctions to cause edge breakdown in the Geiger mode operation. For this reason, the photodiode array PDA3 does not have to be provided with a guard ring for the pn junction of each photodetecting channel CH, either. This allows the photodiode array PDA3 to have a higher aperture rate.

When the aperture rate is higher, it is also feasible to increase the detection efficiency of the photodiode array PDA3.

Since the photodetecting channels CH are separated by the separating portion 40, it becomes feasible to well suppress crosstalk.

Since the readout portions 23a of the signal conducting wires 23 are also formed above the separating portion 40 in the photodiode array PDA3, the aperture rate is more improved. Furthermore, it is considered to be also effective to suppression of dark current.

Since the signal conducting wires 23 are comprised of aluminum, for example, if they are formed on an oxide film, there will arise a problem that aluminum leaks into the underlying film with application of high voltage. In view of this problem, the signal conducting wires 23 are formed on the protecting film 36b of silicon nitride film in the photodiode array PDA3. For this reason, aluminum is prevented from leaking into the underlying film (protecting film 36b) even with application of high voltage to the photodiode array PDA3.

The protecting film 36b and the protecting film 36a or the resistor 24 are layered under the readout portion 23a of each signal conducting wire 23. For this reason, aluminum is well prevented from leaking into the separating portion 40 and the p-type semiconductor layer 35 with application of high voltage.

In the photodiode array PDA3, aluminum is suitably prevented from entering the photodetecting channels CH and separating portion 40 even with application of high voltage.

For example, the resistors 24 of polysilicon (Poly-Si) are formed on the protecting film 36a, and the protecting film 36b and signal conducting wires 23 are formed on the resistors 24.

A p-type semiconductor layer may be used instead of the n-type semiconductor layer 32. In this case, the pn junctions are established between the p-type semiconductor layer and the $n^+$ type substrate member S (substrate 22) and the multiplication portions AM are formed in this p-type semiconductor layer.

Eighth Embodiment

Figure 32:
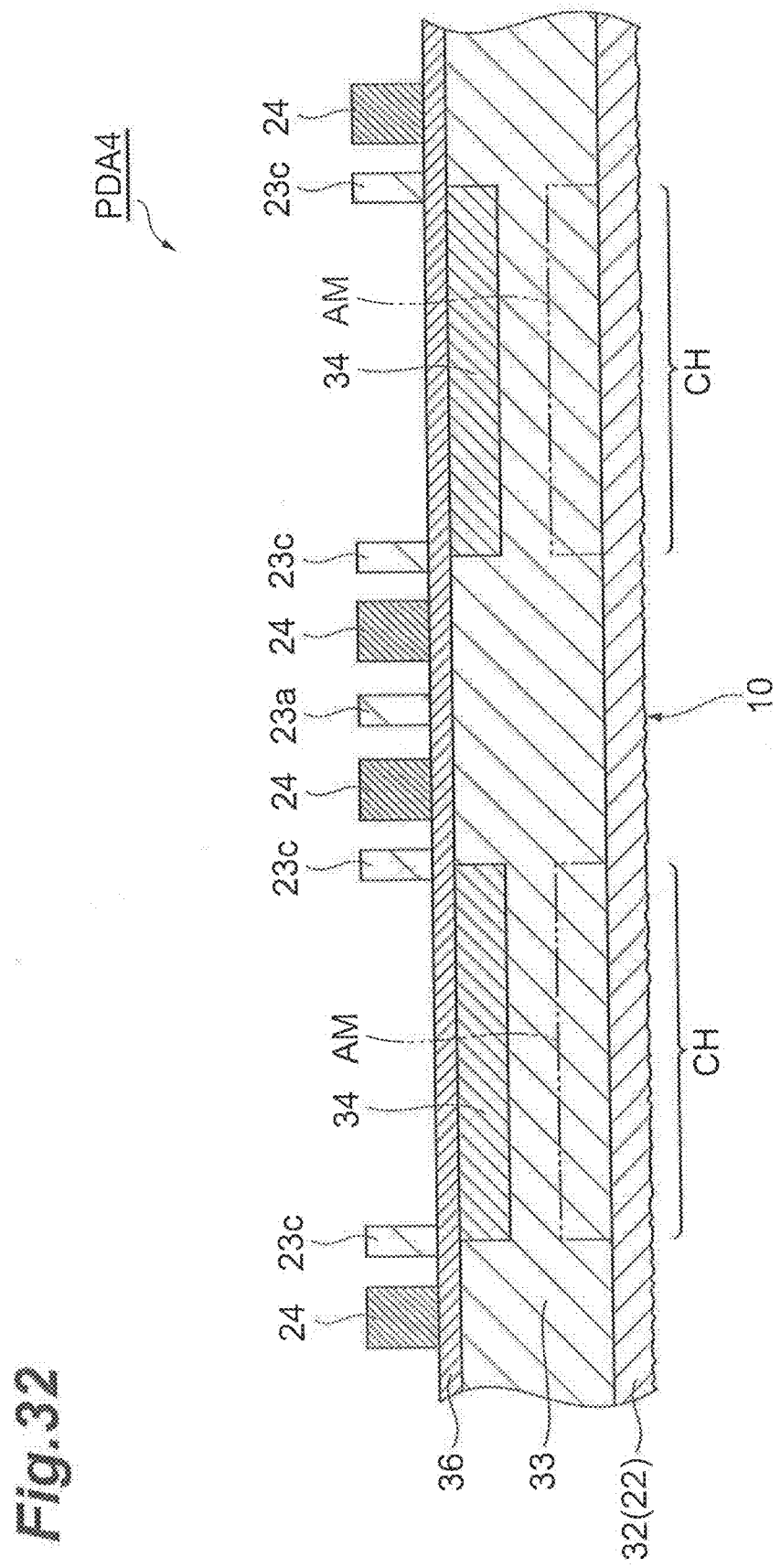
FIG. 32 is a drawing schematically showing a cross-sectional configuration of a photodiode array according to the eighth embodiment.

A configuration of a photodiode array PDA4 according to the eighth embodiment will be described with reference to FIG. 32. FIG. 32 is a drawing schematically showing a cross-sectional configuration of the photodiode array PDA4 of the eighth embodiment. The photodiode array PDA4 of the eighth embodiment is different from the photodiode array PDA1 of the fifth embodiment in that it is not provided with the separating portion 40.

As shown in FIG. 32, the p⁻ type semiconductor layer 33 has a plurality of multiplication regions AM so that the multiplication regions AM correspond to the respective photodetecting channels CH. The signal conducting wires 23 and resistors 24 are formed between the photodetecting channels CH.

In the eighth embodiment, as in the fifth to seventh embodiments, the travel distance of light incident into the photodiode array PDA4 becomes long and the distance of absorption of light also becomes long. This allows the photodiode array PDA4 also to be improved in the spectral sensitivity characteristic in the red to near-infrared wavelength band. Furthermore, the dark current is reduced and the photodetection sensitivity of the photodiode array PDA4 is improved.

The photodiode array PDA4, like the photodiode array PDA1, has no ends (edges) of the pn junctions to cause edge breakdown in the Geiger mode operation, either. For this reason, the photodiode array PDA4 does not have to be provided with a guard ring for the pn junction of each photodetecting channel CH, either. This allows the photodiode array PDA4 to have a higher aperture rate. Furthermore, since the photodiode array PDA4 has no separating portion, it can demonstrate a much higher aperture rate.

When the aperture rate is higher, it is also feasible to increase the detection efficiency of the photodiode array PDA4.

Since the readout portions 23a of the signal conducting wires 23 are formed between the photodetecting channels CH in the photodiode array PDA4, the aperture rate is more improved. Furthermore, it is considered to be also effective to suppression of dark current.

The above described the preferred embodiments of the present invention, but it should be noted that the present invention is not always limited to the above-described embodiments but can be modified in various ways without departing from the scope and spirit of the invention.

In the first to fourth embodiments the irregular asperity 10 is formed by irradiating the entire area of the second principal surface 1b with the pulsed laser beam, but the present invention is not limited to it. For example, the irregular asperity 10 may also be formed by irradiating only the region opposed to the p⁺ type semiconductor region 3 in the second principal surface 1b of the n⁻ type semiconductor substrate 1 with the pulsed laser beam.

In the first to fourth embodiments the electrode 15 is in electrical contact with and connection to the n⁺ type semiconductor region 5 formed on the first principal surface 1a side of the n⁻ type semiconductor substrate 1, but it is not limited only to this example. For example, the electrode 15 may be in electrical contact with and connection to the accumulation layer 11 formed on the second principal surface 1b side of the n⁻ type semiconductor substrate 1. In this case, the electrode 15 is preferably formed outside the region opposed to the p⁺ type semiconductor region 3 in the second principal surface 1b of the n⁻ type semiconductor substrate 1. The reason for it is as follows: if the electrode 15 is formed in the region opposed to the p⁺ type semiconductor region 3 in the second principal surface 1b of the n⁻ type semiconductor substrate 1, the irregular asperity 10 formed in the second principal surface 1b is blocked by the electrode 15, causing an event of reduction in the spectral sensitivity in the near-infrared wavelength band.

The conductivity types of p type and n type in the photodiodes PD1-PD4 in the first to fourth embodiments may be interchanged so as to be reverse to those described above.

In the fifth to eighth embodiments, the number of photodetecting channels formed in the photodiode array is not limited to the number (4×4) in the above embodiments. The number of separating portion 40 formed between the photodetecting channels CH is not limited to the numbers shown in the above embodiments and modification examples, either, but it may be, for example, three or more. The signal conducting wires 23 do not have to be formed above the separating portion 40. The resistors 24 do not have to be formed above the separating portion 40, either. Each of the layers and others does not have to be the one exemplified in the above embodiments and modification examples. The conductivity types of p-type and n-type in the above-described photodiode arrays PDA1-PDA4 may be interchanged so as to be reverse to those described above.

Figure 33:
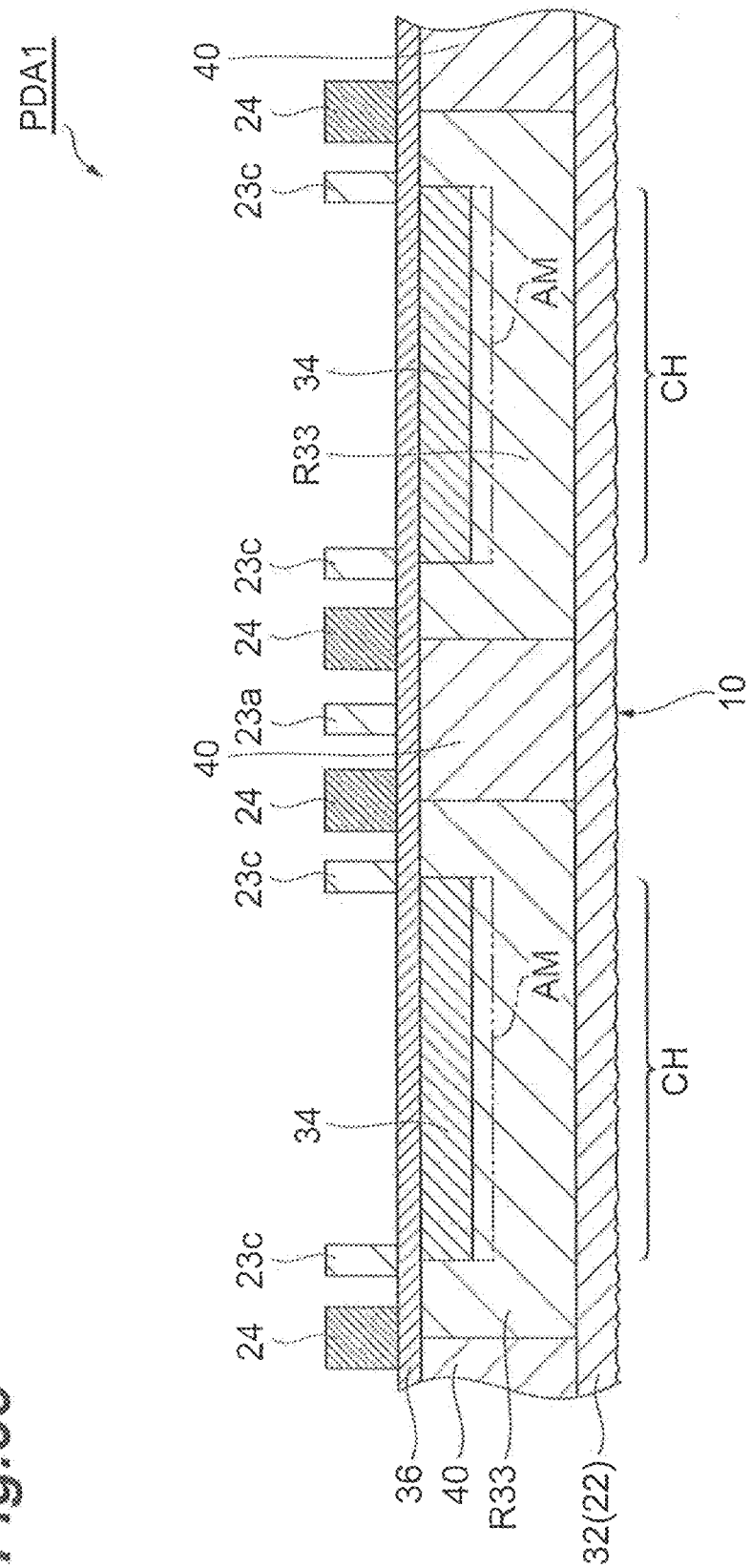
FIG. 33 is a drawing schematically showing a cross-sectional configuration of a photodiode array according to a modification example of the layer structure in the embodiment shown in FIG. 26.
Figure 34:
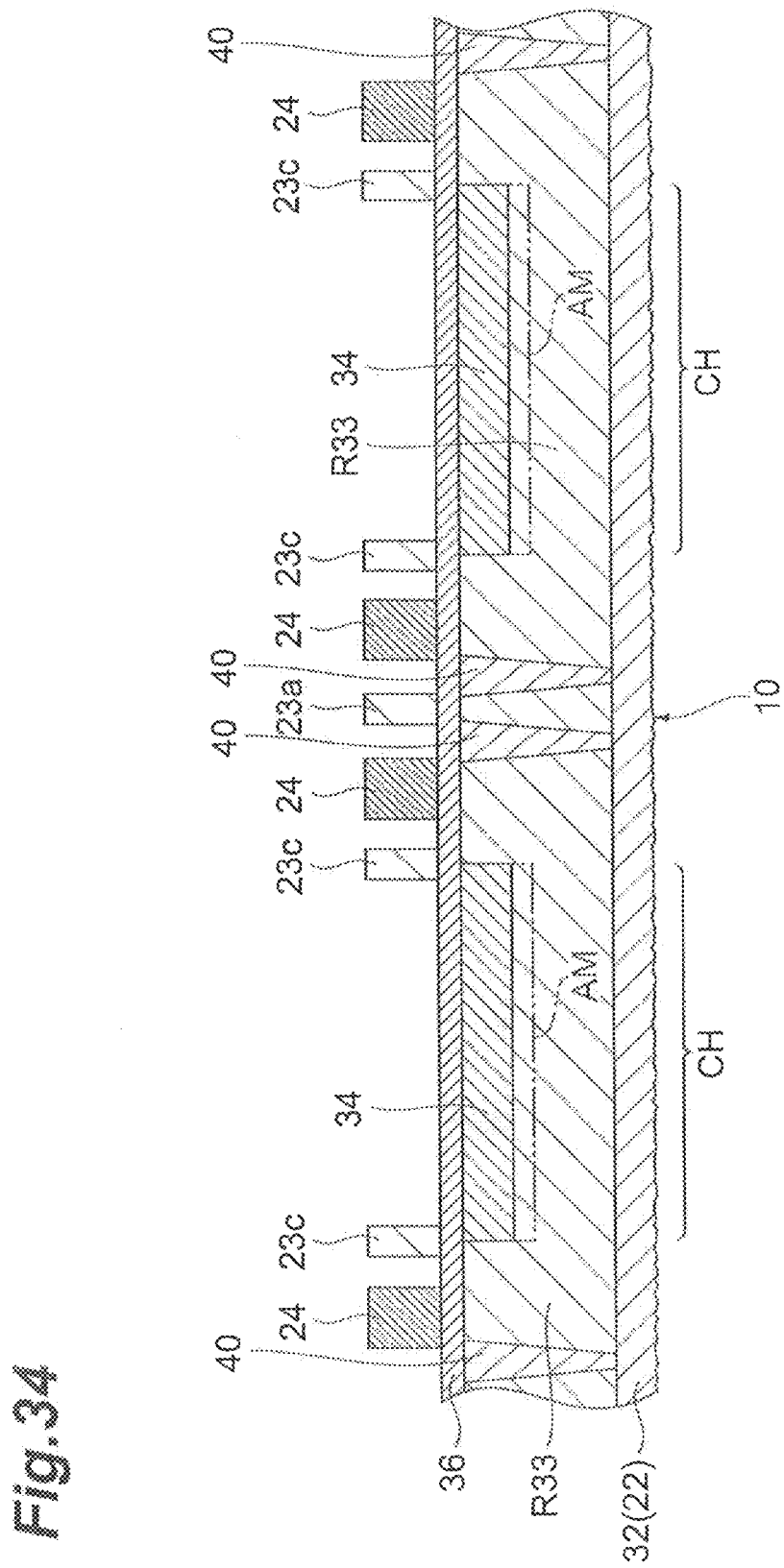
FIG. 34 is a drawing schematically showing a cross-sectional configuration of a photodiode array according to a modification example of the layer structure in the embodiment shown in FIG. 28.
Figure 35:
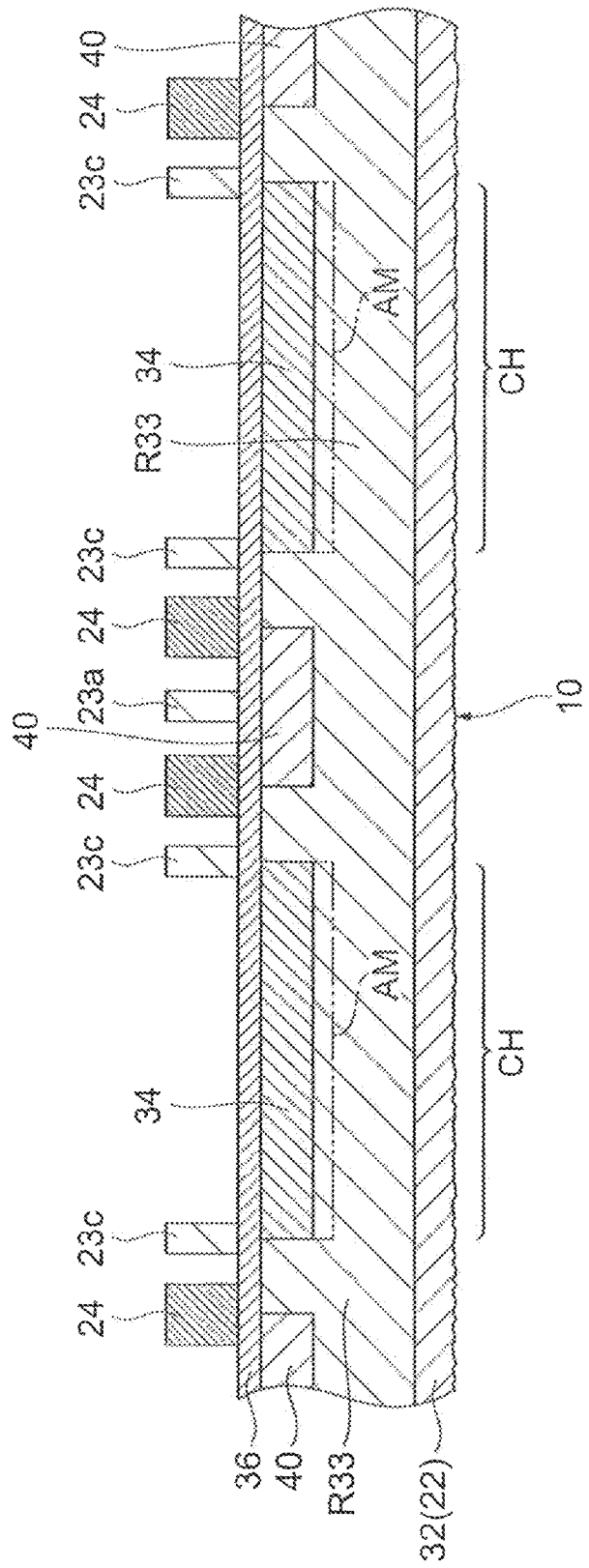
FIG. 35 is a drawing schematically showing a cross-sectional configuration of a photodiode array according to a modification example of the layer structure in the embodiment shown in FIG. 29.
Figure 36:
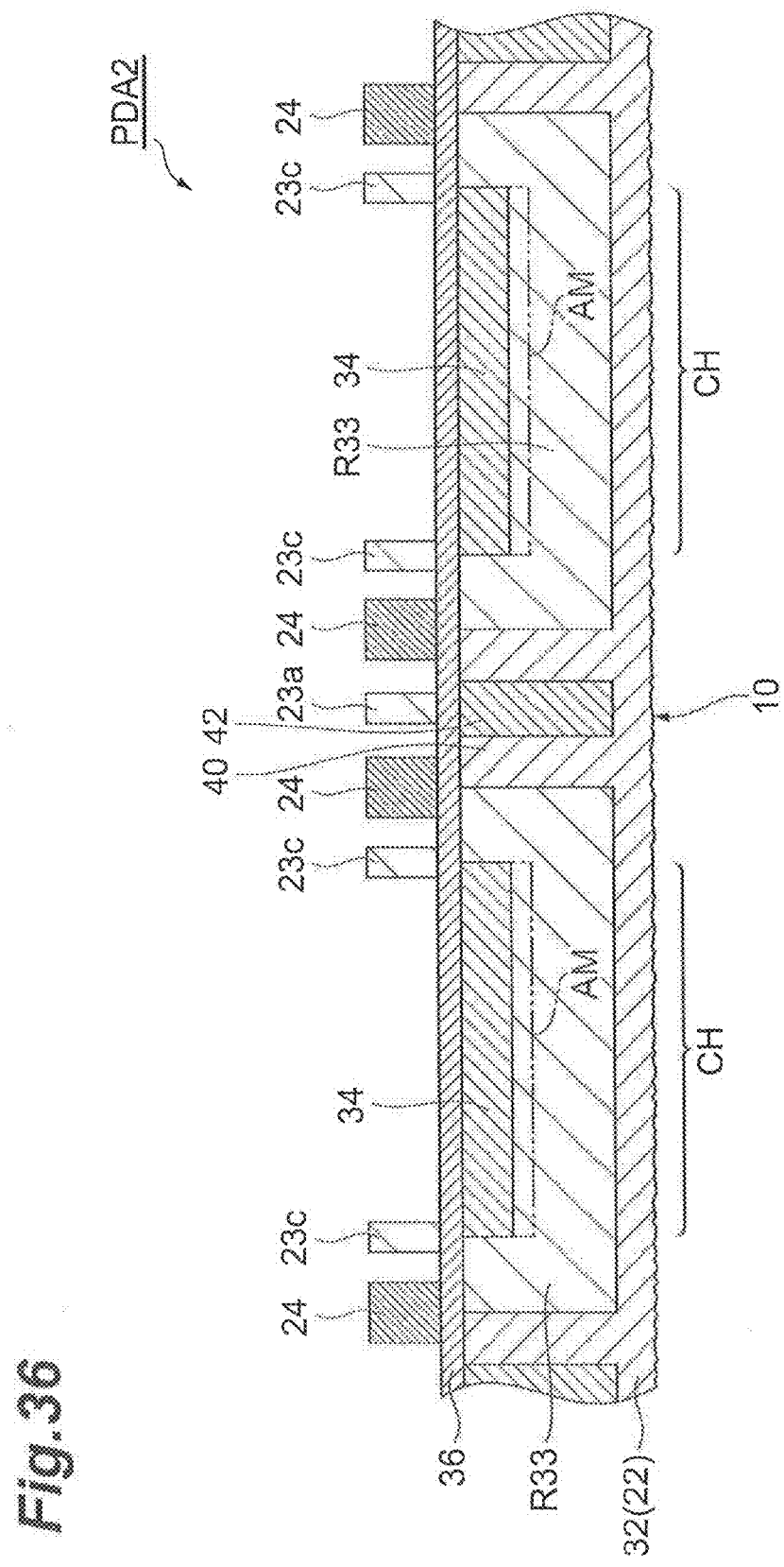
FIG. 36 is a drawing schematically showing a cross-sectional configuration of a photodiode array according to a modification example of the layer structure in the embodiment shown in FIG. 30.
Figure 37:
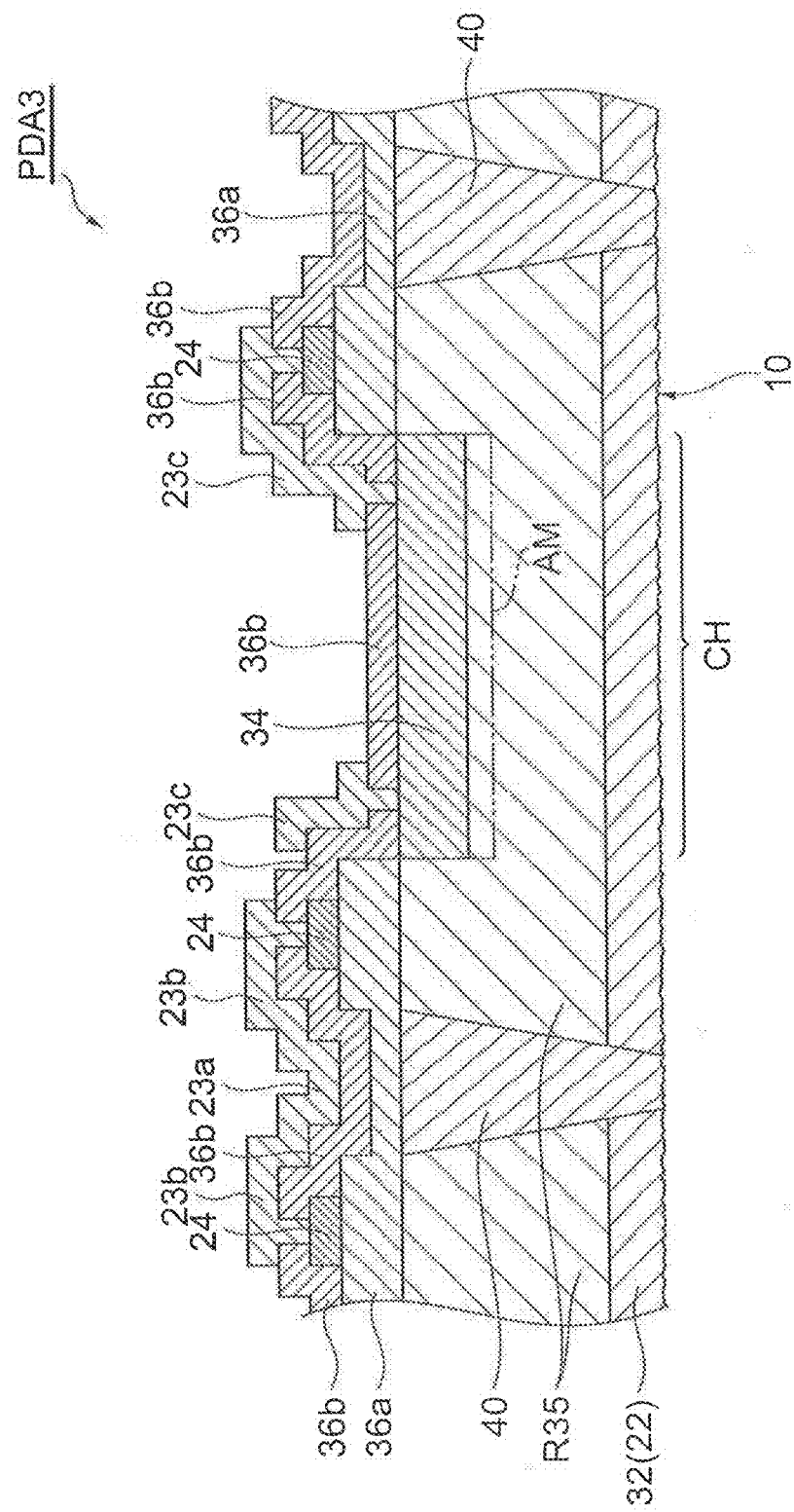
FIG. 37 is a drawing schematically showing a cross-sectional configuration of a photodiode array according to a modification example of the layer structure in the embodiment shown in FIG. 31.
Figure 38:
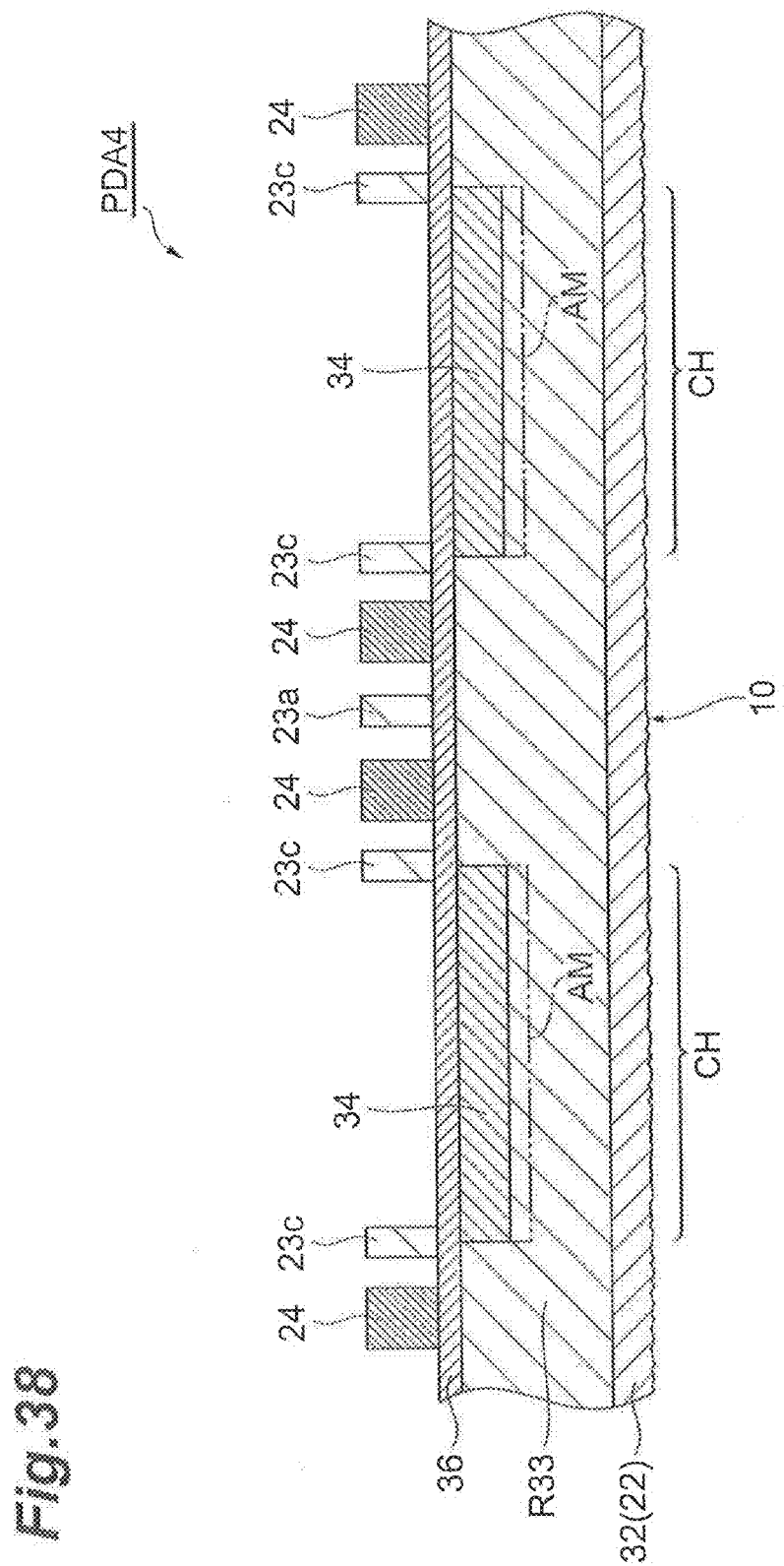
FIG. 38 is a drawing schematically showing a cross-sectional configuration of a photodiode array according to a modification example of the layer structure in the embodiment shown in FIG. 32.

FIG. 33 is a drawing schematically showing a cross-sectional configuration of a photodiode array according to a modification example of the layer structure in the embodiment shown in FIG. 26. FIG. 34 is a drawing schematically showing a cross-sectional configuration of a photodiode array according to a modification example of the layer structure in the embodiment shown in FIG. 28. FIG. 35 is a drawing schematically showing a cross-sectional configuration of a photodiode array according to a modification example of the layer structure in the embodiment shown in FIG. 29. FIG. 36 is a drawing schematically showing a cross-sectional configuration of a photodiode array according to a modification example of the layer structure in the embodiment shown in FIG. 30. FIG. 37 is a drawing schematically showing a cross-sectional configuration of a photodiode array according to a modification example of the layer structure in the embodiment shown in FIG. 31. FIG. 38 is a drawing schematically showing a cross-sectional configuration of a photodiode array according to a modification example of the layer structure in the embodiment shown in FIG. 32. The basic planar configuration and connection relation of these are the same as those shown in FIG. 25.

In the structures shown in FIGS. 33 to 38, as described above, an n-type semiconductor layer R33 or R35 is used instead of the p-type semiconductor layer 33 or p-type semiconductor layer 35 in FIGS. 26, 28, 29, 30, 31, and 32. In this case, the pn junctions are formed at the interface between the low-concentration n-type semiconductor layer R33 (or R35) and the p-type semiconductor regions 34, depleted layers spread from the pn junctions toward the n-type semiconductor layer R33 (or R35), and, corresponding to the depleted layers, the multiplication regions AM are formed from the pn junction interfaces toward the n-type semiconductor layer R33 (or R35). The other structure and action are the same as those as described above.

These photodiode arrays PDA1-PDA4 are configured so that the plurality of photodetecting channels CH for the detection target light to be entered thereinto are formed on the n-type substrate 22 having the n-type semiconductor layer 32. They are the photodiode arrays wherein the plurality of photodetecting channels CH for the detection target light to be entered thereinto are formed on the substrate having the n⁺ type semiconductor layer 32 (S) of the first conductivity type. The plurality of photodetecting channels CH are provided with the substrate 22, the n⁻ type epitaxial semiconductor layer R33 (or R35) of the first conductivity type, the p⁺ type semiconductor regions 34 of the second conductivity type, and the plurality of resistors 24. The epitaxial semiconductor layer R33 (or R35) is formed on the first conductivity type semiconductor layer 32 of the substrate 22. The epitaxial semiconductor layer R33 (or R35) has the plurality of multiplication regions AM for avalanche multiplication of carriers generated with incidence of the detection target light, so that the multiplication regions AM correspond to the respective photodetecting channels. The semiconductor regions 34 are formed in the epitaxial semiconductor layer R33 (or R35) to form the pn junctions at the interface to the epitaxial semiconductor layer R33 (or R35). The plurality of resistors 24 each have the two end portions and are provided for the respective photodetecting channels CH. The plurality of resistors 24 each are electrically connected through the one end portion 24a to the second conductivity type semiconductor region 34 in the epitaxial semiconductor layer R33 (or R35) and are connected through the other end portion 24b to the signal conducting wire 23.

The resistors 24, as shown in FIG. 25, are provided for the respective photodetecting channels CH through the one end portion 24a and channel peripheral portion 23c and are connected each through the other end portion 24b and connecting portion 23b to the readout portion 23a. The plurality of resistors 24 to be connected to the same readout portion 23a are connected to the readout portion 23a.

In these photodiode arrays, the pn junctions are composed of the epitaxial semiconductor layer R33 (or R35) of the first conductivity type on the substrate and the semiconductor regions 34 of the second conductivity type formed in the epitaxial semiconductor layer R33 (or R35). The multiplication regions AM are formed in the epitaxial semiconductor layer R33 (or R35) where the pn junctions are substantialized, and the multiplication regions AM corresponding to the respective photodetecting channels are present in the epitaxial semiconductor layer R33 (or R35).

INDUSTRIAL APPLICABILITY

The present invention is applicable to semiconductor photodetection elements and photodetection apparatus.

LIST OF REFERENCE SIGNS 1 n⁻ type semiconductor substrate; 1a first principal surface; 1b second principal surface; 3 p⁺ type semiconductor region; 5 n⁺ semiconductor region: 10 irregular asperity; 11 accumulation layer; 13, 15 electrodes; 22 substrate; 23 signal conducting wires; 24 resistors; 25 electrode pad; 31 insulating film; 32 n⁺ type semiconductor layer; 33 p⁻ type semiconductor layer; 34 p⁺ type semiconductor regions; 35 p-type semiconductor layer; 36 protecting film; 40 separating portion; 42 light shielding portion; AM multiplication regions; CH photodetecting channels; S substrate member; PL pulsed laser beam; PD1-PD4 photodiodes; PDA1-PDA4 photodiode arrays.

The invention claimed is:

1. A back-illuminated type photodiode array in which a plurality of photodetecting channels configured for detection target light to enter thereinto are formed on a silicon substrate having a semiconductor layer of a first conductivity type, the photodiode array comprising:
an epitaxial semiconductor layer of a second conductivity type formed on the semiconductor layer of the first conductivity type, forming pn junctions at an interface of the semiconductor layer, and having a plurality of multiplication regions for avalanche multiplication of carriers generated with incidence of the detection target light, so that the multiplication regions correspond to the respective photodetecting channels; and
a plurality of resistors each having two end portions, provided for the respective photodetecting channels, and each electrically connected through one of the end portions to the epitaxial semiconductor layer and connected through the other of the end portions to a signal conducting wire,
wherein an irregular asperity is formed in at least a surface corresponding to the photodetecting channels in the semiconductor layer of the first conductivity type,
wherein at least the surface corresponding to the photodetecting channels in the semiconductor layer of the first conductivity type is optically exposed, and
wherein the surface where the irregular asperity is formed constitutes a light incident surface, light incident from the surface travels in the silicon substrate.

2. The back-illuminated type photodiode array according to claim 1, wherein the irregular asperity is further formed in a surface corresponding to a region between the plurality of photodetecting channels in the semiconductor layer of the first conductivity type and the surface is optically exposed.

3. The back-illuminated type photodiode array according to claim 1, wherein in the silicon substrate, a portion where the plurality of photodetecting channels are formed is thinned while leaving a surrounding region around said thinned portion.

4. The back-illuminated type photodiode array according to claim 1, wherein a thickness of the semiconductor layer of the first conductivity type is larger than a height difference of the irregular asperity.

5. The back-illuminated type photodiode array according to claim 1, wherein the light incident from the surface is scattered by the irregular asperity.

6. The back-illuminated type photodiode array according to claim 1, wherein the light incident from the surface and traveling in the silicon substrate is reflected, scattered, or diffused by the irregular asperity.

7. A back-illuminated type photodiode array in which a plurality of photodetecting channels configured for detection target light to enter thereinto are formed on a silicon substrate having a semiconductor layer of a first conductivity type, the photodiode array comprising:
an epitaxial semiconductor layer of the first conductivity type formed on the semiconductor layer of the first conductivity type, and having a plurality of multiplication regions for avalanche multiplication of carriers generated with incidence of the detection target light, so that the multiplication regions correspond to the respective photodetecting channels;
a semiconductor region of a second conductivity type formed in the epitaxial semiconductor layer of the first conductivity type and forming pn junctions at an interface of the epitaxial semiconductor layer; and
a plurality of resistors each having two end portions, provided for the respective photodetecting channels, and each electrically connected through one of the end portions to the semiconductor region of the second conductivity type in the epitaxial semiconductor layer and connected through the other of the end portions to a signal conducting wire,
wherein an irregular asperity is formed in at least a surface corresponding to the photodetecting channels in the semiconductor layer of the first conductivity type,
wherein at least the surface corresponding to the photodetecting channels in the semiconductor layer of the first conductivity type is optically exposed, and
wherein the surface where the irregular asperity is formed constitutes a light incident surface, light incident from the surface travels in the silicon substrate.

8. The back-illuminated type photodiode array according to claim 7, wherein the irregular asperity is further formed in a surface corresponding to a region between the plurality of photodetecting channels in the semiconductor layer of the first conductivity type and the surface is optically exposed.

9. The back-illuminated type photodiode array according to claim 7, wherein in the silicon substrate, a portion where the plurality of photodetecting channels are formed is thinned while leaving a surrounding region around said thinned portion.

10. The back-illuminated type photodiode array according to claim 7, wherein a thickness of the semiconductor layer of the first conductivity type is larger than a height difference of the irregular asperity.

11. The back-illuminated type photodiode array according to claim 7, wherein the light incident from the surface is scattered by the irregular asperity.

12. The back-illuminated type photodiode array according to claim 7, wherein the light incident from the surface and traveling in the silicon substrate is reflected, scattered, or diffused by the irregular asperity.

* * * * *